United States Patent
Chen et al.

(10) Patent No.: US 12,336,248 B2
(45) Date of Patent: Jun. 17, 2025

(54) NON-CONFORMAL GATE OXIDE FORMATION ON FinFET

(71) Applicant: Taiwan Semiconductor Manufacturing Co., Ltd., Hsinchu (TW)

(72) Inventors: Tsung-Ju Chen, Hsinchu (TW); Shu-Han Chen, Hsinchu (TW); Chun-Heng Chen, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 449 days.

(21) Appl. No.: 17/662,532

(22) Filed: May 9, 2022

(65) Prior Publication Data
US 2023/0126442 A1    Apr. 27, 2023

Related U.S. Application Data

(60) Provisional application No. 63/271,345, filed on Oct. 25, 2021.

(51) Int. Cl.
| H10D 64/01 | (2025.01) |
| H10D 30/01 | (2025.01) |

(52) U.S. Cl.
CPC ......... H10D 64/017 (2025.01); H10D 30/024 (2025.01)

(58) Field of Classification Search
CPC ............... H01L 29/6656; H01L 29/785; H01L 21/02274; H01L 21/823431
See application file for complete search history.

(56) References Cited

U.S. PATENT DOCUMENTS

| 10,128,156 B1 | 11/2018 | Chiang et al. |
| 11,430,865 B2* | 8/2022 | Chen ................... H01L 29/0673 |
| 2003/0042531 A1 | 3/2003 | Lee et al. |
| 2014/0284667 A1* | 9/2014 | Basker ................. H01L 29/785 |
| | | 257/288 |
| 2015/0009110 A1 | 4/2015 | Xie et al. |
| 2015/0091100 A1 | 4/2015 | Xie et al. |
| 2015/0147482 A1* | 5/2015 | Kang .................. C23C 16/4404 |
| | | 427/535 |
| 2016/0111541 A1 | 4/2016 | Chang et al. |

(Continued)

FOREIGN PATENT DOCUMENTS

| KR | 20190132171 A | 11/2019 |
| KR | 20200014254 A | 2/2020 |
| KR | 20210102807 A | 8/2021 |

Primary Examiner — Hsien Ming Lee
(74) Attorney, Agent, or Firm — Slater Matsil, LLP

(57) ABSTRACT

A method includes forming a dummy gate oxide on a wafer, and the dummy gate oxide is formed on a sidewall and a top surface of a protruding semiconductor fin in the wafer. The formation of the dummy gate oxide may include a Plasma Enhanced Chemical Vapor Deposition (PECVD) process in a deposition chamber, and the PECVD process includes applying a Radio Frequency (RF) power to a conductive plate below the wafer. The method further includes forming a dummy gate electrode over the dummy gate oxide, removing the dummy gate electrode and the dummy gate oxide to form a trench between opposing gate spacers, and forming a replacement gate in the trench.

20 Claims, 25 Drawing Sheets

(56) References Cited

U.S. PATENT DOCUMENTS

| | | | |
|---|---|---|---|
| 2016/0204245 A1* | 7/2016 | Jangjian | H01L 29/0649 |
| | | | 438/283 |
| 2018/0233398 A1 | 8/2018 | Van Cleemput et al. | |
| 2019/0088521 A1 | 3/2019 | Chua et al. | |
| 2019/0355823 A1 | 11/2019 | Lin et al. | |
| 2020/0043799 A1 | 2/2020 | Lee et al. | |
| 2020/0168507 A1 | 5/2020 | Chang et al. | |
| 2020/0286790 A1* | 9/2020 | Hong | H01L 29/7851 |
| 2020/0328123 A1* | 10/2020 | Liu | H01L 29/7854 |
| 2021/0233997 A1 | 7/2021 | Chen et al. | |
| 2021/0249271 A1 | 8/2021 | Peng et al. | |
| 2023/0008994 A1* | 1/2023 | Lin | H01L 29/66795 |

* cited by examiner

NON-CONFORMAL GATE OXIDE FORMATION ON FinFET

PRIORITY CLAIM AND CROSS-REFERENCE

This application claims the benefit of the following provisionally filed U.S. Patent application: Application No. 63/271,345, filed on Oct. 25, 2021, and entitled "Non-Conformal Gate Oxide Formation on FinFET by Substrate Bias RF Function Implement," which application is hereby incorporated herein by reference.

BACKGROUND

Transistors are basic building elements in integrated circuits. In previous development of the integrated circuits, Fin Field-Effect Transistors (FinFETs) have been formed to replace planar transistors. In the formation of FinFETs, semiconductor fins are formed, and dummy gates are formed on the semiconductor fins. The formation of the dummy gates may include depositing a dummy layer such as a polysilicon layer, and then patterning the dummy layer as dummy gates. Gate spacers are formed on the sidewalls of the dummy gate stacks. The dummy gate stacks are then removed to form trenches between the gate spacers. Replacement gates are then formed in the trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
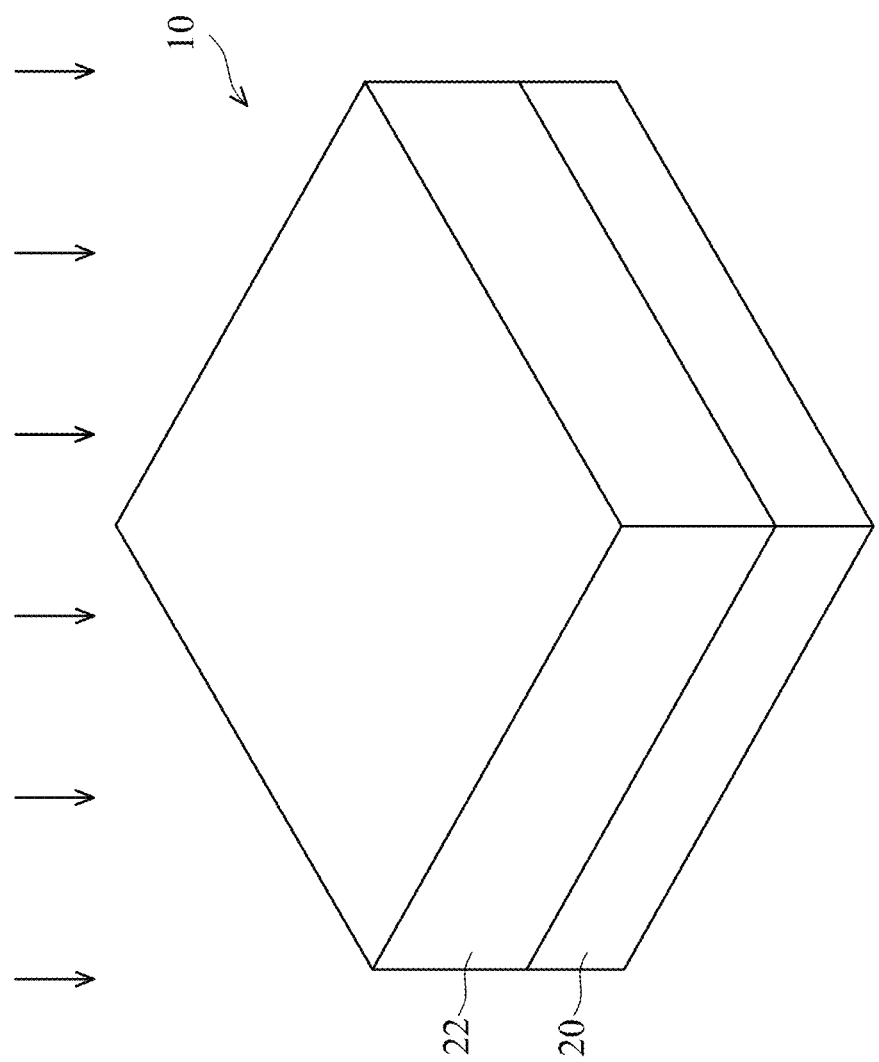
FIGS. 1-3, 4A, 4B, 5A, 5B, 6A, 6B, 6C, 7-9, 10A, 10B, 11A, 11B, 12, 13, 14A, 14B, 14C, and 15 illustrate perspective views and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A non-conformal capping layer and the method of forming the same are provided in accordance with some embodiments. The intermediate stages in the formation of the non-conformal capping layer and using it in the formation of a Fin Field-Effect Transistor (FinFET) are illustrated in accordance with some embodiments. Some variations of some embodiments are discussed. The embodiments may also be applied on other embodiments in which non-conformal layers are to be formed, which may be, or may not be, in FinFET processes. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 17:
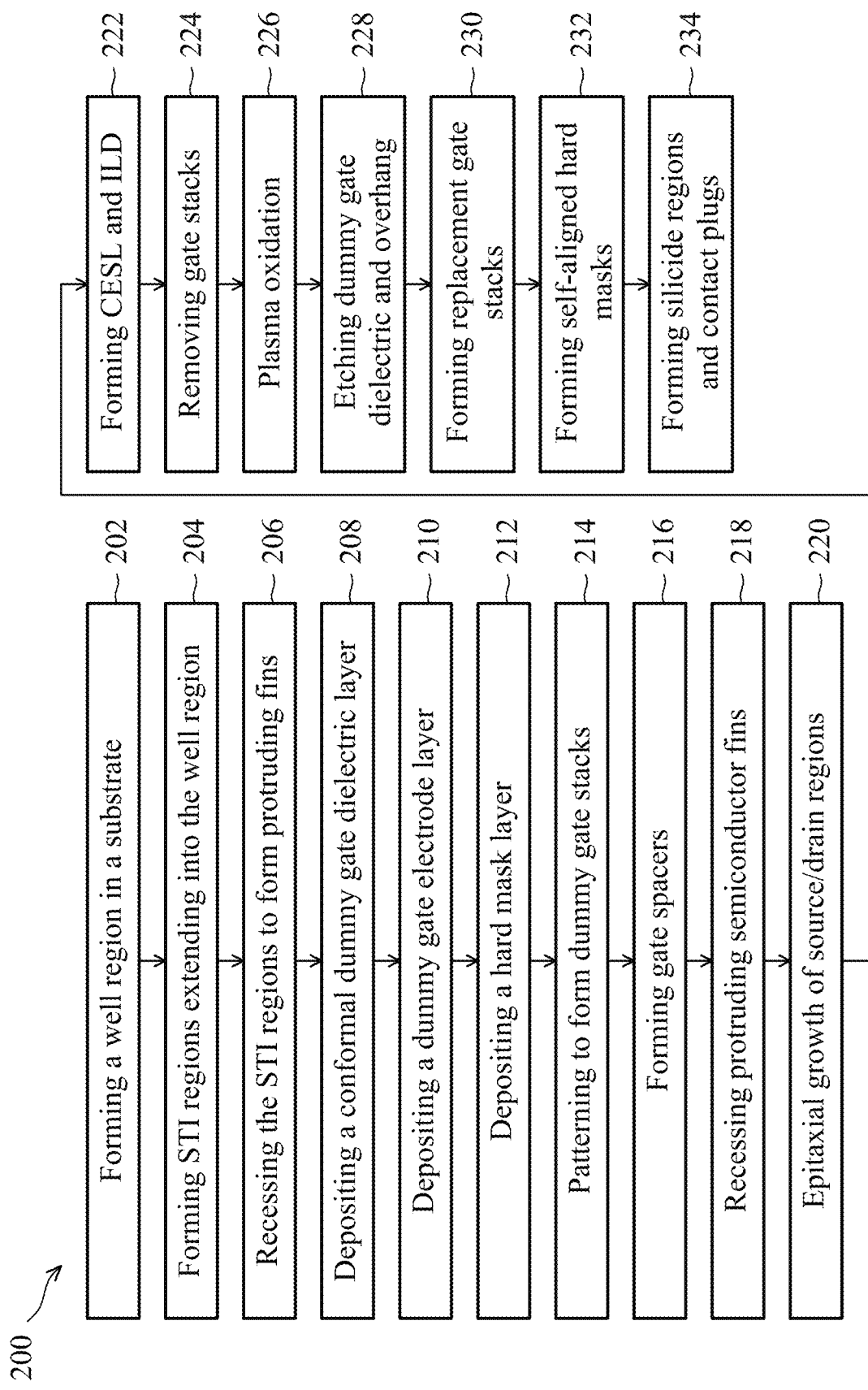
FIG. 17 illustrates a process flow for forming a FinFET in accordance with some embodiments.

FIGS. 1-3, 4A, 4B, 5A, 5B, 6A, 6B, 6C, 7-9, 10A, 10B, 11A, 11B, 12, 13, 14A, 14B, 14C, and 15 illustrate the cross-sectional views and perspective views of intermediate stages in the formation of a FinFET in accordance with some embodiments of the present disclosure. The corresponding processes are also reflected schematically in the process flow 200 as shown in FIG. 17.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 as shown in FIG. 17. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
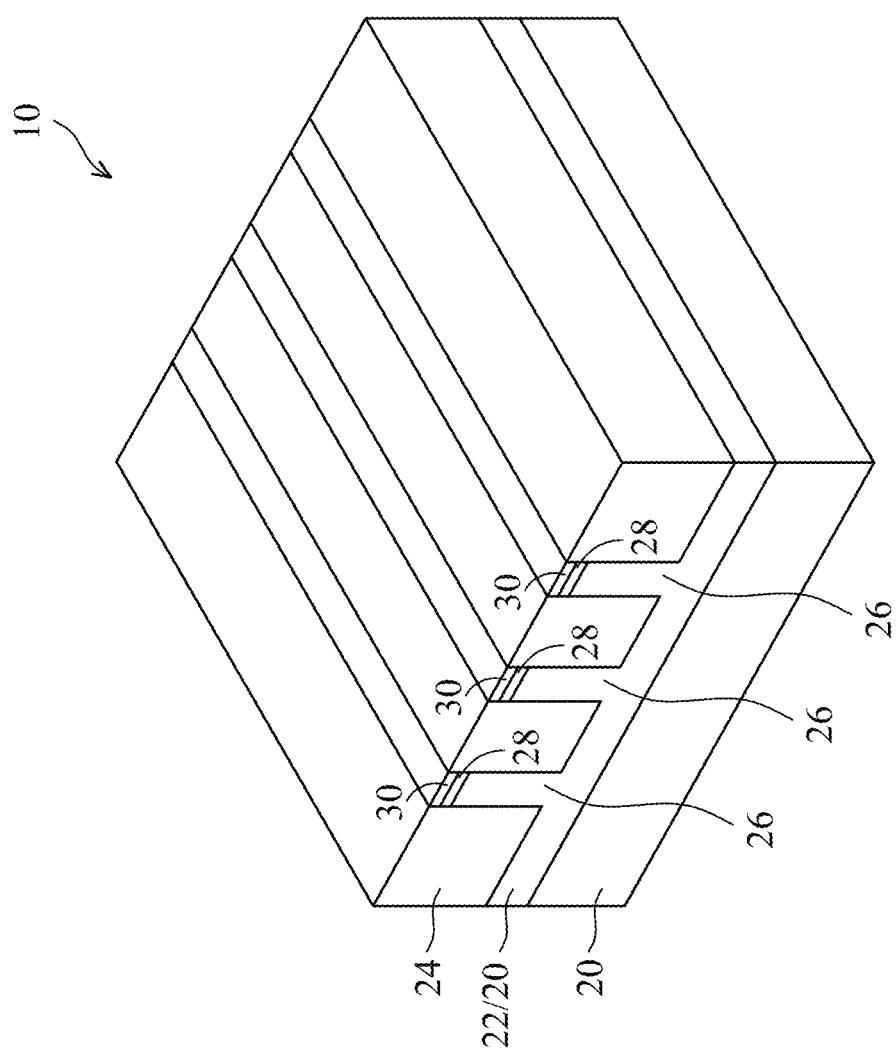

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 as shown in FIG. 17. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photoresist (not shown) is formed on hard mask layer 30 and is then patterned. Hard mask layer 30 is then patterned using the patterned photoresist as an etching mask to form patterned hard mask layers 30 (which are alternatively referred to as hard masks 30 hereinafter) as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner dielectric, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
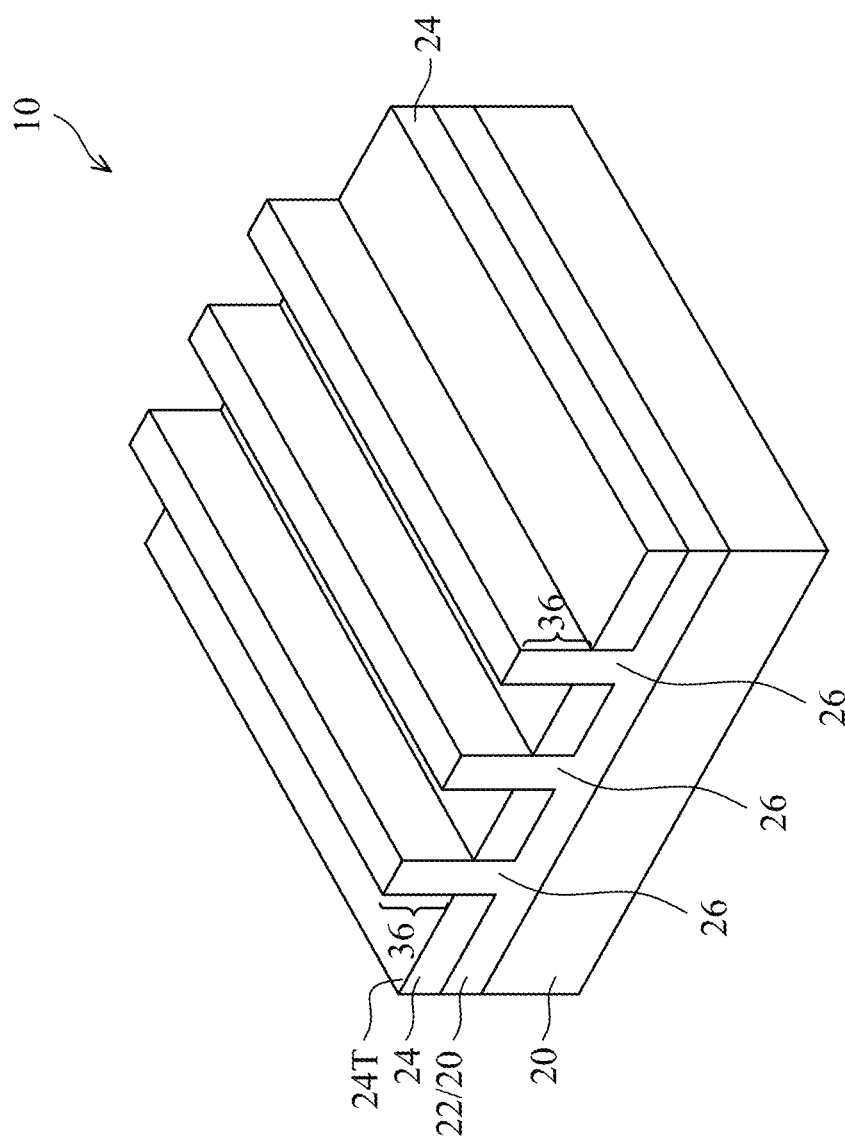

Referring to FIG. 3, STI regions 24 are recessed. The top portions of semiconductor strips 26 thus protrude higher than the top surfaces 24T of the remaining portions of STI regions 24 to form protruding fins 36. The respective process is illustrated as process 206 in the process flow 200 as shown in FIG. 17. The etching may be performed using a dry etching process, wherein HF and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example. The top surfaces and the bottom surfaces of STI regions 24 are referred to as 24T and 24B, respectively.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4A:
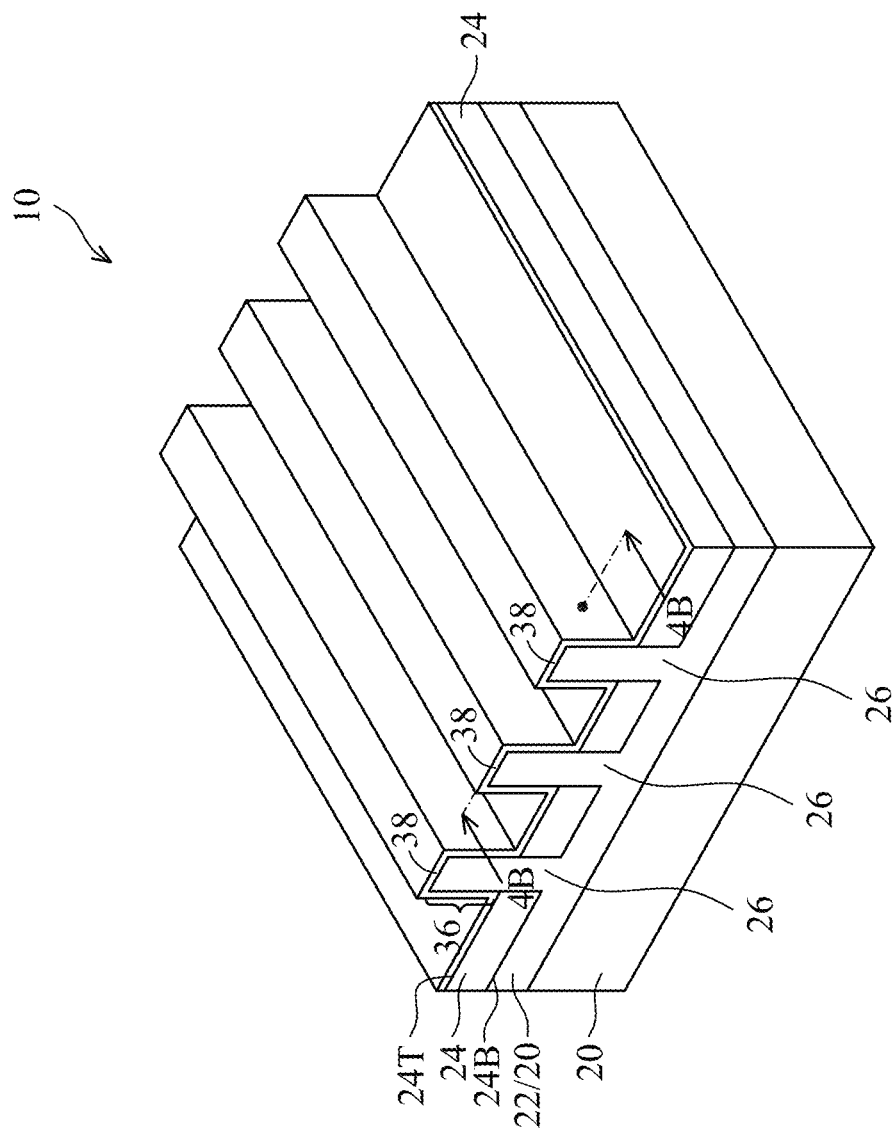
Figure 4B:
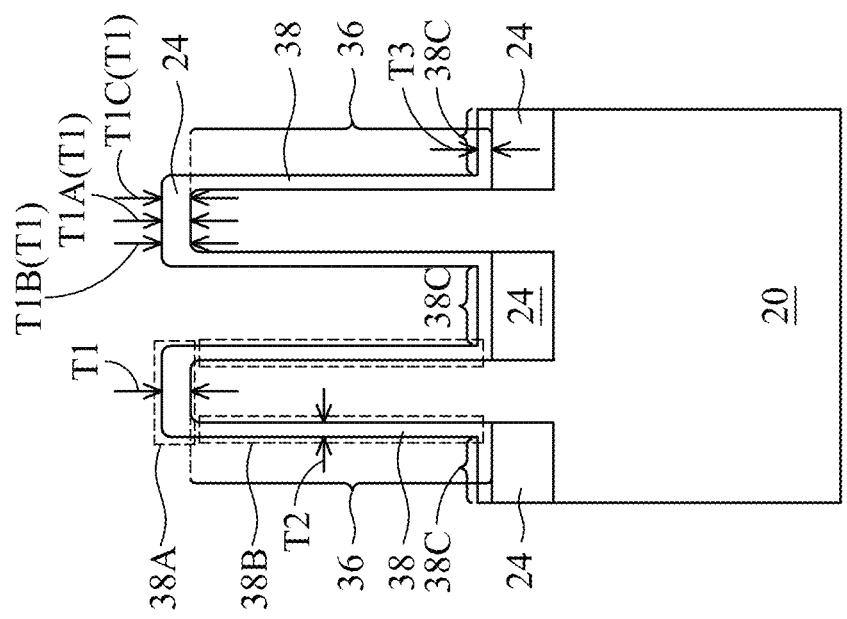

FIGS. 4A, 4B, 5A, 5B, 6A, 6B, and 6C illustrate the formation of dummy gate stacks 45 in accordance with some embodiments. Referring to FIGS. 4A and 4B, non-conformal dielectric layer 38 is formed on the sidewalls and the top surfaces of protruding fins 36, and on the top surface of STI regions 24. The respective process is illustrated as process 208 in the process flow 200 as shown in FIG. 17. FIG. 4B illustrates the vertical cross-section 4B-4B as shown in FIG. 4A. In accordance with some embodiments of the present disclosure, non-conformal dielectric layer 38 is formed using a deposition process, which may include Plasma Enhanced Chemical Vapor Deposition (PECVD), Plasma Enhanced Atomic Layer Deposition (PEALD), or the like, while process conditions are adjusted to achieve non-conformity. In accordance with some embodiments, the precursors may include Silane, aminosilanes, di-sec-butylaminosilane (DSBAS), bis(tert-butylamino)silane (BTBAS), or the like, or combinations thereof as the silicon source gas. An oxidizing agent such as ozone (O$_3$), oxygen (O$_2$), or the like, or a combination thereof is also used as an oxygen source. The material of non-conformal dielectric layer 38 may include silicon oxide, while other dielectric material such as silicon nitride, silicon carbo-nitride, silicon oxynitride, or the like, may also be used.

Dielectric layer 38, when formed in Input-Output (IO) device region, may be used as the gate dielectric of the IO transistors. On the other hand, in some device regions such as core device regions or memory device regions, dielectric layer 38 is removed later, and hence is also referred to as a dummy non-conformal gate dielectric layer. Accordingly, non-conformal dielectric layer 38 is also referred to as dummy gate dielectric layer 38 or IO gate dielectric (or IO oxide) 38.

Referring to FIG. 4B, dummy gate dielectric layer 38 includes a top portion 38A directly over protruding fins 36, and the top thickness of the top portion is denoted as T1. Thickness T1 may be measured at a middle vertical line of the corresponding protruding fin 36. In accordance with some embodiments, top portion 38A has a uniform thickness. For example, as shown in FIG. 4B, thicknesses T1A, T1B, and T1C may be the same, with variations smaller than about 5 percent or less. Dummy gate dielectric layer 38 further includes sidewall portions 38B on the sidewalls of protruding fins 36, and horizontal portions 38C overlapping and contacting the top surfaces of STI regions 24. The thickness T3 of the horizontal portions 38C may be equal to or smaller than thickness T1, and may be equal to or smaller than thickness T2. For example, when protruding fins 36 are very close to each other, thickness T3 may be reduced, for example, to be equal to or smaller than thickness T1.

The sidewall thickness of the sidewall portions of dummy gate dielectric layer 38 is denoted as T2 in FIG. 4B. In accordance with some embodiments of the present disclosure, thickness T2 is measured at the middle height of protruding fin 36, which middle height is between the top surfaces and the bottoms of protruding fins 36. Top thickness T1 is greater than sidewall thickness T2. In accordance with some embodiments, thickness ratio T1/T2 is greater than 1.0, and may be greater than about 1.1, and may further be in the range between about 1.2 and about 2.0. In accordance with some embodiments of the present disclosure, the top thickness T1 may be in the range between about 16 Å and about 70 Å. The sidewall thickness T2 may be in the range between 15 Å and about 35 Å.

Figure 16:
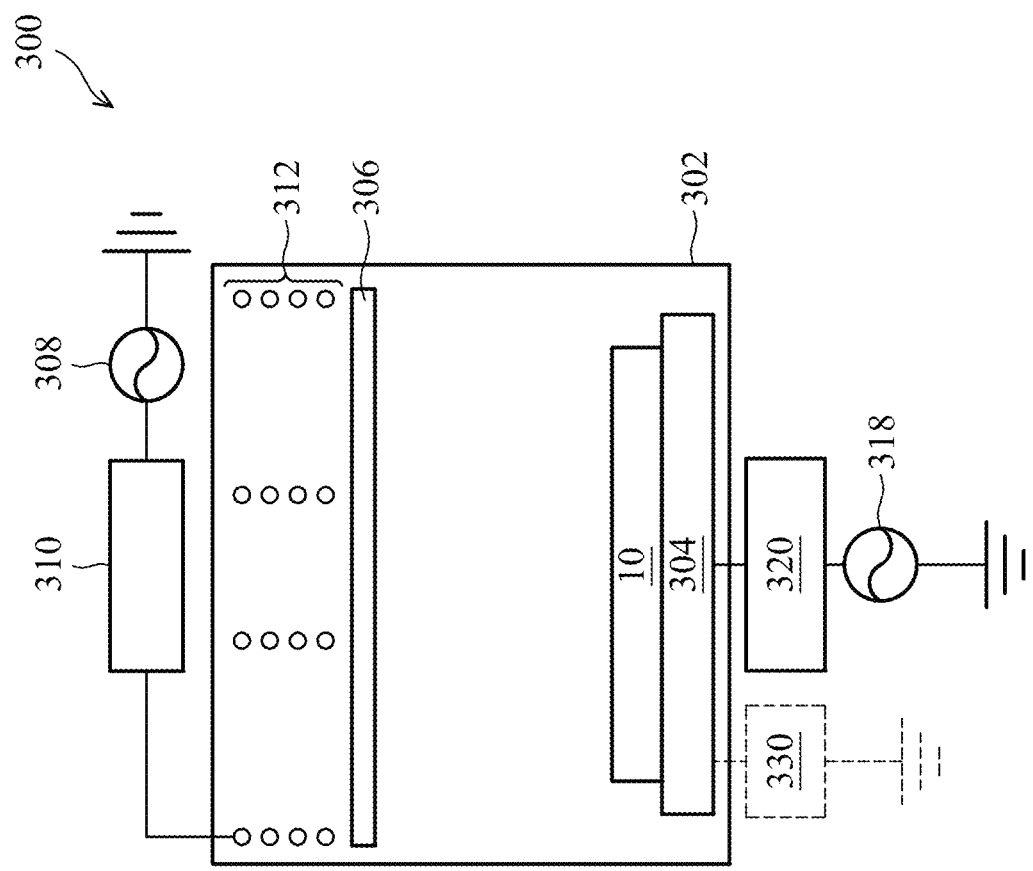
FIG. 16 illustrates a production tool in accordance with some embodiments.

FIG. 16 illustrates a deposition tool 300 in accordance with some embodiments. Deposition tool 300 may be used for selected deposition process such as PECVD, PEALD, or the like, which are for depositing dummy dielectric layer 38. Deposition tool 300 includes chamber 302 configured to maintain a vacuum environment, electronic-chuck (E-Chuck) 304, and top plate 306. Wafer 10, which may have the structure shown in FIG. 3, is placed and fixed on E-chuck 304. A coil 312 may be placed having a part over top plate 306. Coil 312 may provide the Radio Frequency (RF) power for generating plasma from process gases in chamber 302. RF generator 308 is connected to, and is configured to generate the RF power to feed to coil 312. RF matching unit 310 is connected between the RF generator 308 and coil 312, and is used for matching the impedance of the chamber 302 (and coil 312) with the impedance of RF generator 308. RF generator 308 may be electrically grounded. In accordance with some embodiments, RF generator 308 generates a current/power having a frequency in RF range or microwave range. For example, the frequency of the RF power may be 13.56 MHz, while a different frequency may be used. In accordance with some embodiments, the power provided by RF generator 308 may be lower than about 100 watts.

E-chuck 304 may be electrically connected to RF generator 318, for example, through RF matching unit 320. In accordance embodiments, E-Chuck 304 (or a bottom plate underlying E-Chuck 304) is connected to RF generator 318. Both of E-Chuck 304 and the bottom plate (if any) are referred to as conductive plates hereinafter. RF matching unit 320 is configured to match the impedance of the loading of E-chuck 304 with the impedance of RF generator 318. One end of RF generator 318 is directly connected to (or electrically coupled to indirectly through other devices in between) electrical ground. In accordance with some embodiments, RF generator 318 generates power/current with a frequency in RF range or microwave range. For example, the frequency of the current may be 13.56 MHz, while a different frequency may be used. The frequency of the power generated by RF generator 318 may be equal to, higher than, or lower than the frequency of the power generated by RF generator 308. RF generator 318 is also configured to have an adjustable output power. In accordance with some embodiments, the power PW318 provided by RF generator 318 is lower than about 200 watts, and may be in the range between about 10 watts and about 200 watts.

Due to the electrical grounding of RF generator 318 at one end, a non-ground bias voltage is generated on E-chuck 304 (or the conductive bottom plate underlying E-Chuck 304). In accordance with some embodiments, the bias voltage on E-chuck 304 is a negative voltage. The magnitude of the bias voltage is correlated to the power PW318 provided by RF generator 318, and the greater the power PW318 is, the greater the magnitude of the negative bias voltage is. For example, when the power PW318 is in the range between 0 watts and about 200 watts, the magnitude of the bias voltage may be in the range between 0 volts and about 100 volts.

It is appreciated that if RF generator 318 is not adopted, and when E-Chuck 304 is electrically grounded, or RF generator 318 is adopted but the power PW318 is zero watts, the deposition of dielectric layer 38 (FIG. 4A) would have been isotropic, and dielectric layer 38 may be a conformal layer having a uniform thickness. With the increase in the power PW318, anisotropic effect is added to the isotropic effect. Accordingly, the top portion 38A (FIG. 4B) becomes thicker than sidewall portions 38B. The anisotropic effect becomes stronger with the increase in the power PW318, and the increase in the magnitude of the negative bias voltage. Accordingly, with the increase in power PW318, thickness ratio T1/T2 increases. It is appreciated that with the increase in power PW318, the increase in the bias voltage may saturate. Furthermore, with the negative bias voltage have a too-high magnitude, protruding fin 36 (FIG. 4B) may be damaged in the deposition of dielectric layer 38 due to bombardment. Accordingly, the power PW318 may be selected to be lower than about 200 watts, and thickness ratio T1/T2 may be selected to be lower than 2.0, by selecting the proper power PW318.

In accordance with some embodiments, throughout the deposition of dummy gate dielectric layer 38, a uniform power PW318 is provided by RF generator 318. In accordance with alternative embodiments, the deposition of a lower portion of the deposition of dummy gate dielectric layer 38 is performed with power PW318 being zero watts or a low non-zero value. The lower portion has the function of protecting the underlying protruding fins 36 in subsequent deposition. After the lower portion of dummy gate dielectric layer 38 is deposited, the power PW 318 is increased to a non-zero value, for example, in the range between about 10 watts and about 200 watts to deposit an upper portion of dummy gate dielectric layer 38. When the power is increased, the protruding fins 36 are protected by the deposited lower portion of dummy gate dielectric layer 38.

In accordance with yet alternative embodiments, the deposition of a lower portion of the deposition of dummy gate dielectric layer 38 is performed with power PW318 being zero watts or a low non-zero value, and with the increase in thickness T1 (FIG. 4B), the power PW318 is gradually increased. The increase of power PW318 may be continuous or through multiple stages. With the increase in the thickness of the deposited lower portion, the protection provided by the lower portion is also improved, allowing increasingly higher power to be used without damaging protruding fins 36.

In accordance with alternative embodiments, instead of using RF generator 318 and RF matching unit 320, a DC voltage source 330 is adopted, and has its negative end connecting to electrical ground, and the other end (positive end) connecting to E-Chuck 304. Accordingly, E-Chuck 304 or a conductive plate underlying the E-Chuck is also at a negative bias voltage, which may be in the same range as that is generated by the RF generator 318, for example, with a magnitude in the range between about 0 volts and about 500 volts. The DC voltage source 330 results in dummy dielectric layer 38 to be non-conformal also.

Referring back to FIGS. 4A and 4B, after the deposition of dummy gate dielectric layer 38, an annealing process may be performed. The annealing process may be performed at a temperature in the range between about 400° C. and about 1,000° C., depending on the method of the annealing. The annealing method may include Rapid Thermal Annealing, furnace annealing, spike annealing, or the like. The annealing may improve the quality of dummy gate dielectric layer 38.

Figure 5A:
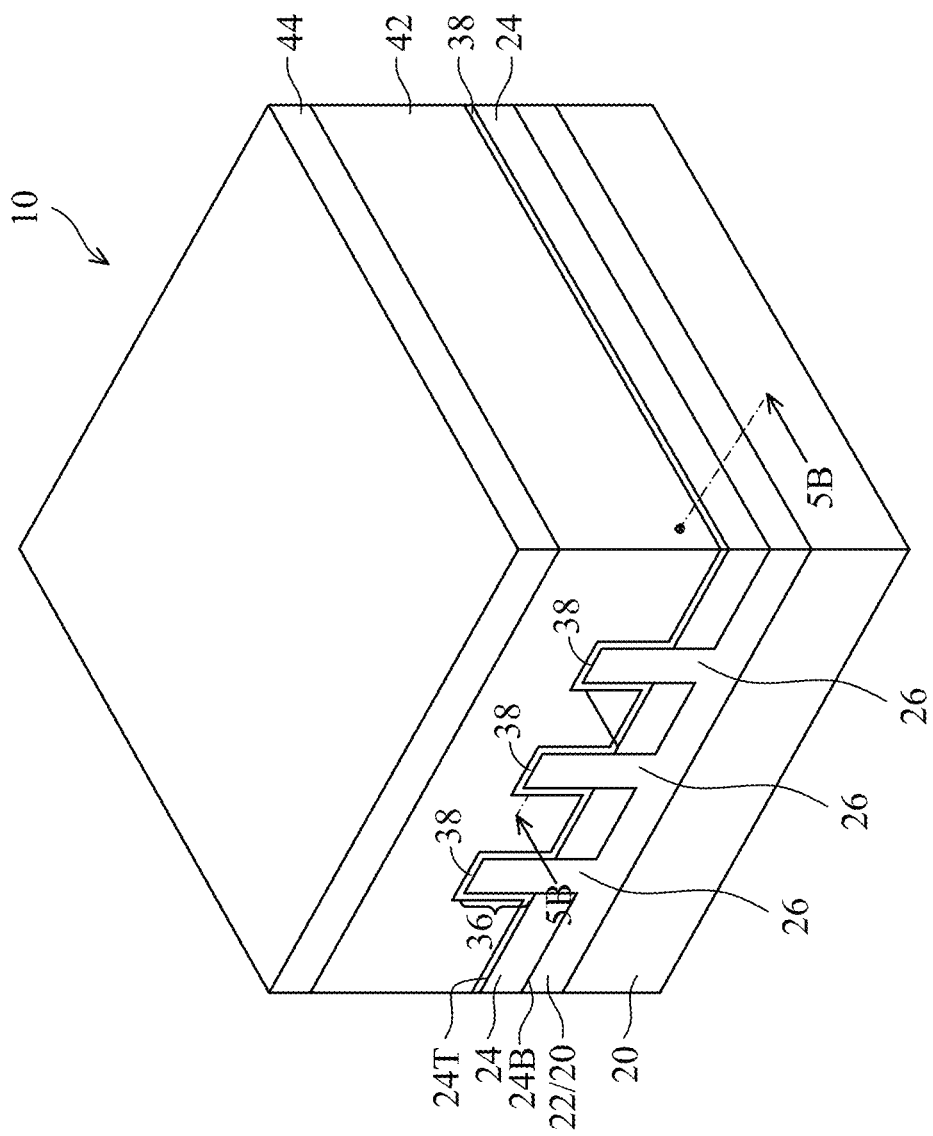
Figure 5B:
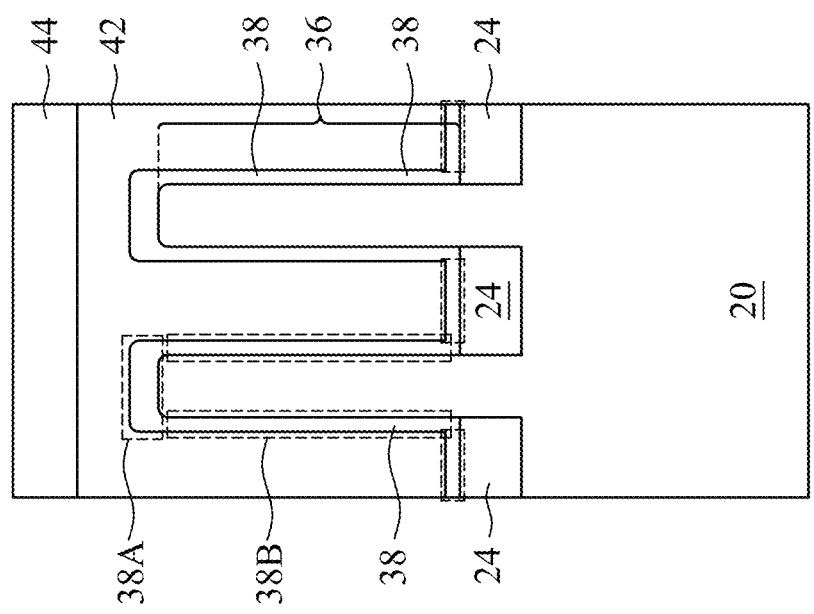

FIGS. 5A and 5B illustrate the deposition of dummy gate electrode layer 42. The respective process is illustrated as process 210 in the process flow 200 as shown in FIG. 17. FIG. 5B illustrates the reference cross-section 5B-5B in FIG. 5A. Dummy gate electrode layer 42 may be formed of or comprise polysilicon or amorphous silicon, and other materials may also be used. The formation process may include a deposition process followed by a planarization process. Hard mask layer 44 is then deposited on dummy gate electrode layer 42. The respective process is illustrated as process 212 in the process flow 200 as shown in FIG. 17. Hard mask layer 44 may be formed of or comprise silicon nitride, silicon oxide, silicon oxy-carbo-nitride, or multi-layers thereof.

Figure 6A:
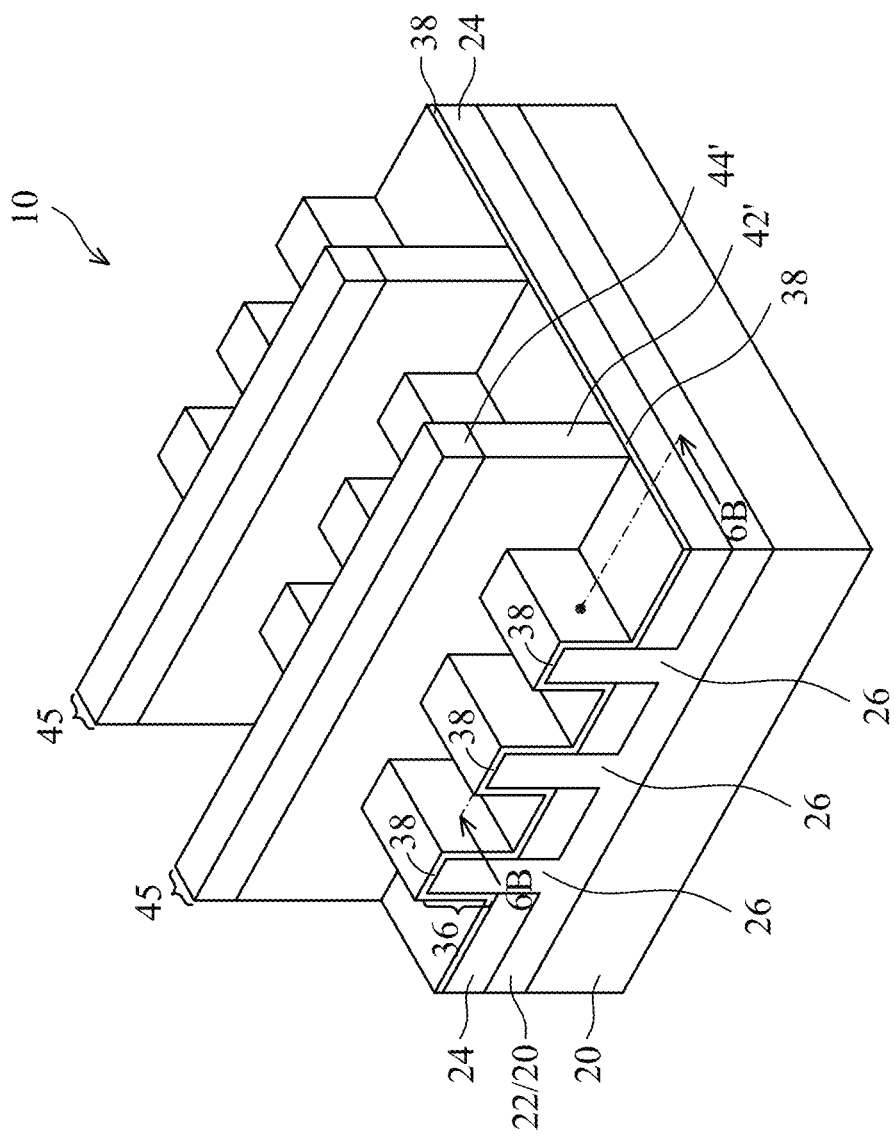
Figure 6B:
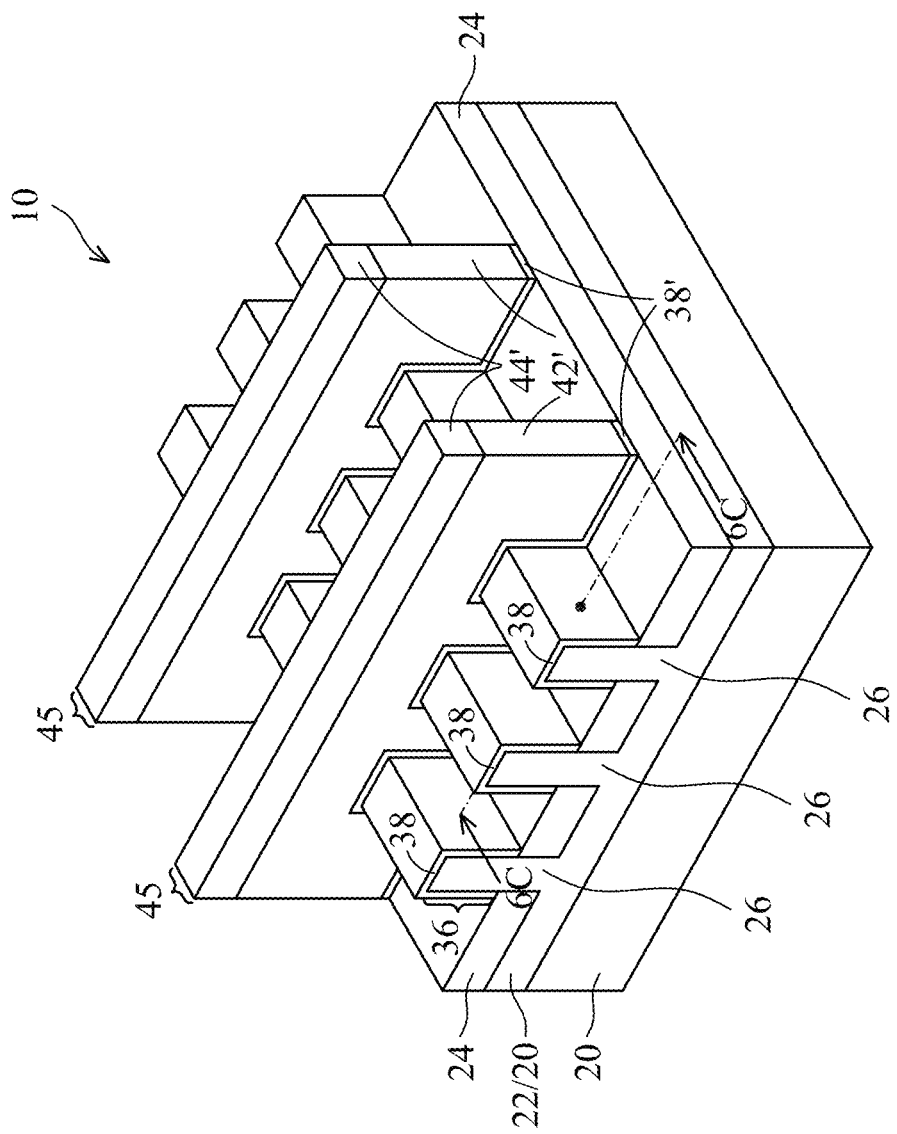
Figure 6C:
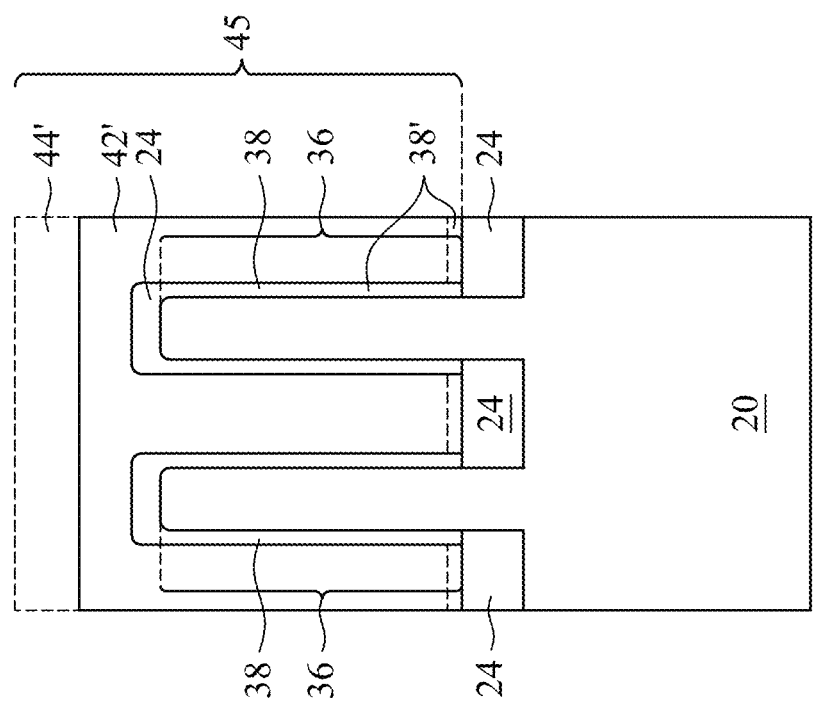

FIGS. 6A, 6B, and 6C illustrate the patterning process for forming dummy gate stacks 45. The respective process is illustrated as process 214 in the process flow 200 as shown in FIG. 17. FIGS. 6A and 6B illustrate the structures in accordance with different embodiments. In accordance with some embodiments of the present disclosure, hard mask layer 44 is first patterned, for example, using a patterned photoresist as an etching mask. The resulting hard masks are referred to as hard masks 44'. Hard masks 44' are then used as an etching mask to etch the underlying dummy gate electrode layer 42 in order to form dummy gate electrodes 42'. The etching is performed using an anisotropic etching process.

FIG. 6A illustrates an embodiment in which the remaining portions of dummy dielectric layer 38 have horizontal portions remaining on top surfaces of STI regions 24. FIG. 6B illustrates an embodiment in which the portions of dummy dielectric layer 38 on the top surfaces of STI regions 24 have been removed. FIG. 6C illustrates the reference cross-section 6C-6C in FIG. 6A or 6B. In FIG. 6C, the portions of dummy gate dielectrics 38' on the top surfaces of STI regions 24 are shown using dashed lines to indicate these portions may, or may not exist. Hard masks 44', dummy gate electrodes 42', and dummy gate dielectrics 38' (if patterned) are collectively referred to dummy gate stacks 45.

The etching of dummy gate electrode layer 42, which may be formed of polysilicon or amorphous silicon, may be performed using a process gas comprising fluorine ($F_2$), Chlorine ($Cl_2$), hydrogen chloride (HCl), hydrogen bromide (HBr), Bromine ($Br_2$), $C_2F_6$, $CF_4$, $SO_2$, the mixture of HBr, $Cl_2$, and $O_2$, or the mixture of HBr, $Cl_2$, $O_2$, and $CH_2F_2$ etc. In the etching process of dummy gate electrode layer 42, dummy gate dielectric layer 38 is used as the etch stop layer. The top portions of dummy gate dielectric layer 38 are thick, and may act as a hard mask. Otherwise, when the top portions of dummy gate dielectric layer 38 are not thick enough, if dummy dielectric layer 38 is etched-through, since protruding fins 36 may be formed of a same or a similar material (such as silicon) as dummy gate electrode layer 42, the protruding fins 36 will be severely damaged or even completely removed. The dummy gate dielectric layer 38, which is thicker at the tops of protruding fins 36, provides enhanced protection to the underlying protruding fins 36.

In the cases in which dummy gate dielectric layer 38 is etched-through, since the thick top portions of dummy gate dielectric layer 38 delays the etching-through, the damage to the underlying protruding fins 36 is also reduced.

Figure 7:
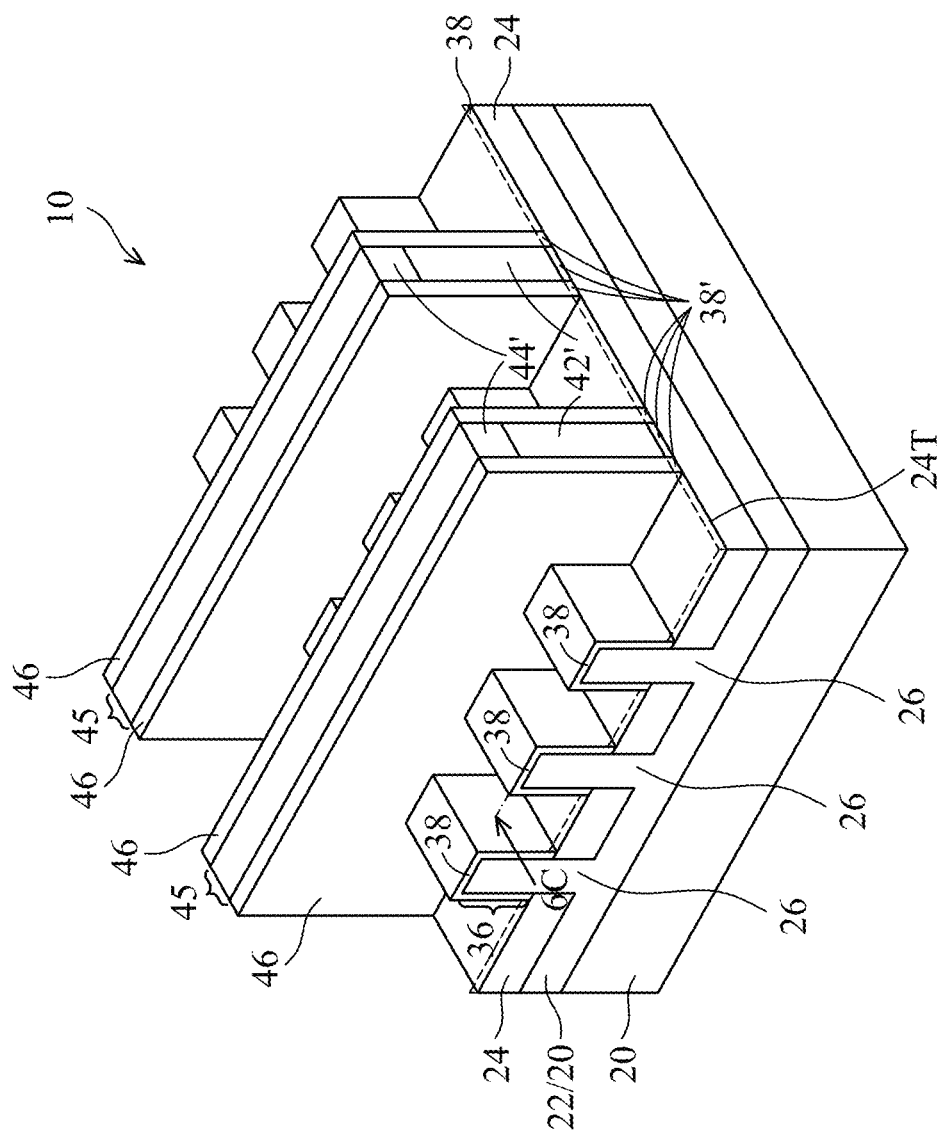

Next, as shown in FIG. 7, gate spacers 46 are formed on the sidewalls of dummy gate stacks 45. The respective process is illustrated as process 216 in the process flow 200 as shown in FIG. 17. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers. In FIG. 7, dashed lines are used to represent the portions of dummy gate dielectric layer 38 that may or may not exist.

Figure 8:
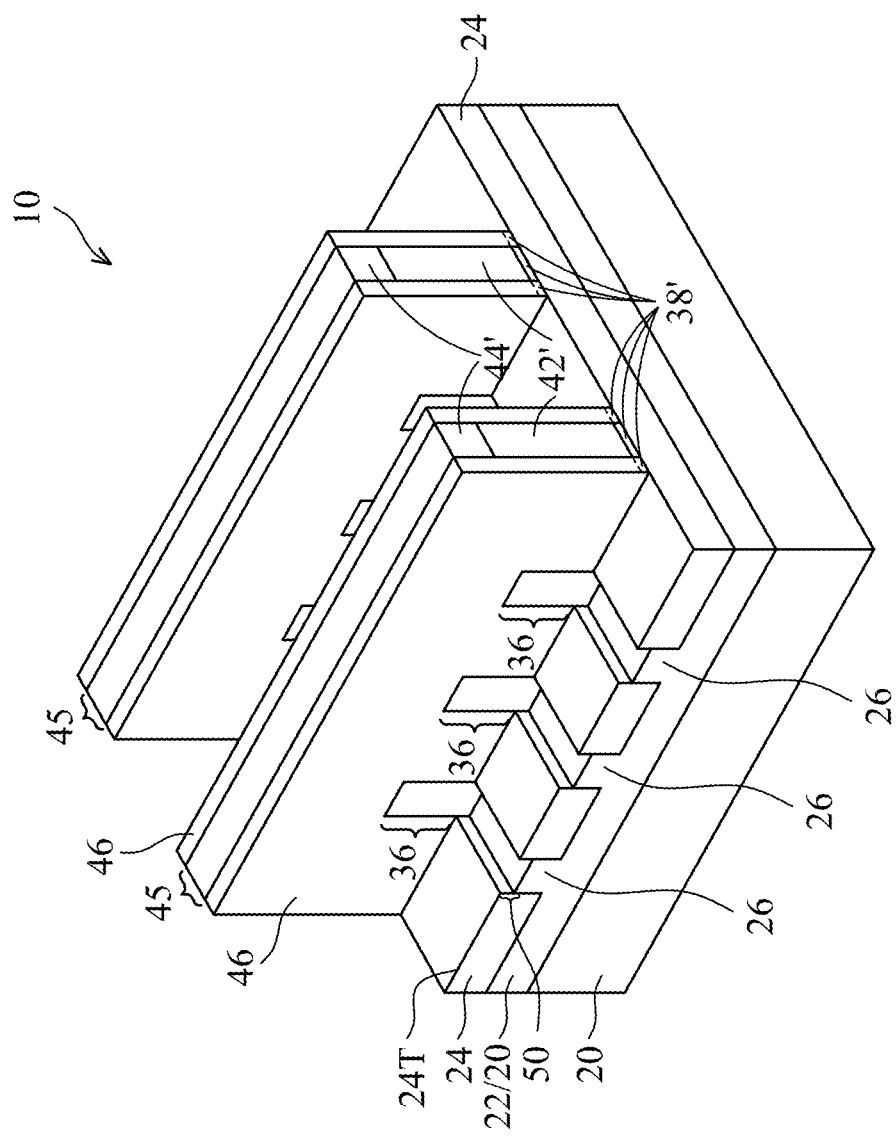

Referring to FIG. 8, an etching process(es) is performed to etch protruding fins 36. The exposed portions of dummy gate dielectric layer 38 are also etched. The respective process is illustrated as process 218 in the process flow 200 as shown in FIG. 17. If the horizontal portions of dummy gate dielectric layer 38 have not been removed in preceding processes, they are also patterned to form dummy gate dielectrics 38'. Dashed lines are used to show dummy gate dielectrics 38' may, or may not, extend directly underlying gate spacers 46. The portions of protruding fins 36 that are not covered by dummy gate stacks 45 and gate spacers 46 are also etched. The recessing may be anisotropic, and hence the portions of protruding fins 36 directly underlying dummy gate stacks 45 and gate spacers 46 are protected, and are not etched. The top surfaces of the recessed semiconductor strips 26 may be lower than the top surfaces 24T of STI regions 24 in accordance with some embodiments. Recesses 50 are accordingly formed. Recesses 50 comprise some portions located on the opposite sides of dummy gate stacks 45, and some portions between remaining portions of protruding fins 36. There may be, or may not be, fin spacers left on the opposite sides of recesses 50, which fin spacers are not illustrated.

Figure 9:
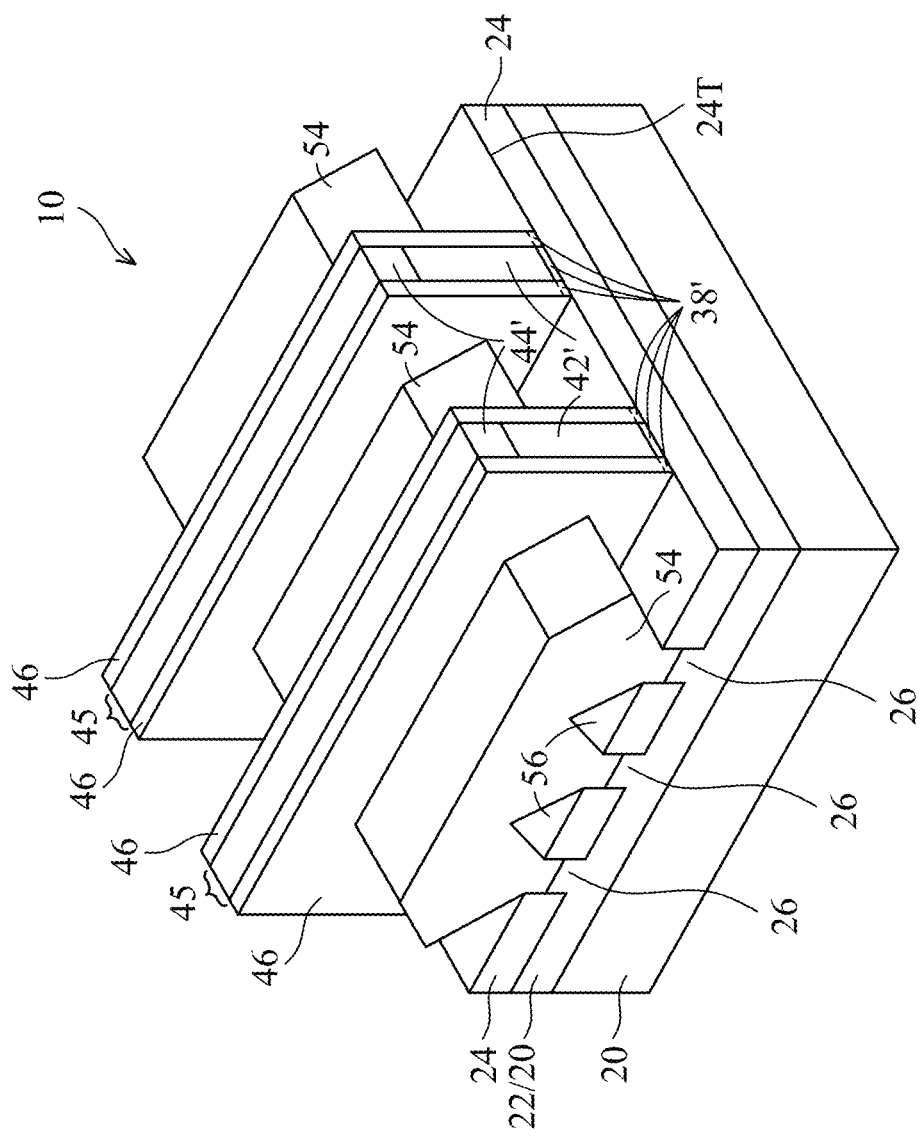

Next, epitaxy regions (source/drain regions) 54 are formed by selectively growing (through epitaxy) a semiconductor material in recesses 50, resulting in the structure in FIG. 9. The respective process is illustrated as process 220 in the process flow 200 as shown in FIG. 17. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof.

After Recesses 50 are filled with epitaxy regions 54, the further epitaxial growth of epitaxy regions 54 may cause epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar, which is achieved by further growing on the epitaxy regions 54 as shown in FIG. 9.

After the epitaxy step, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 10A:
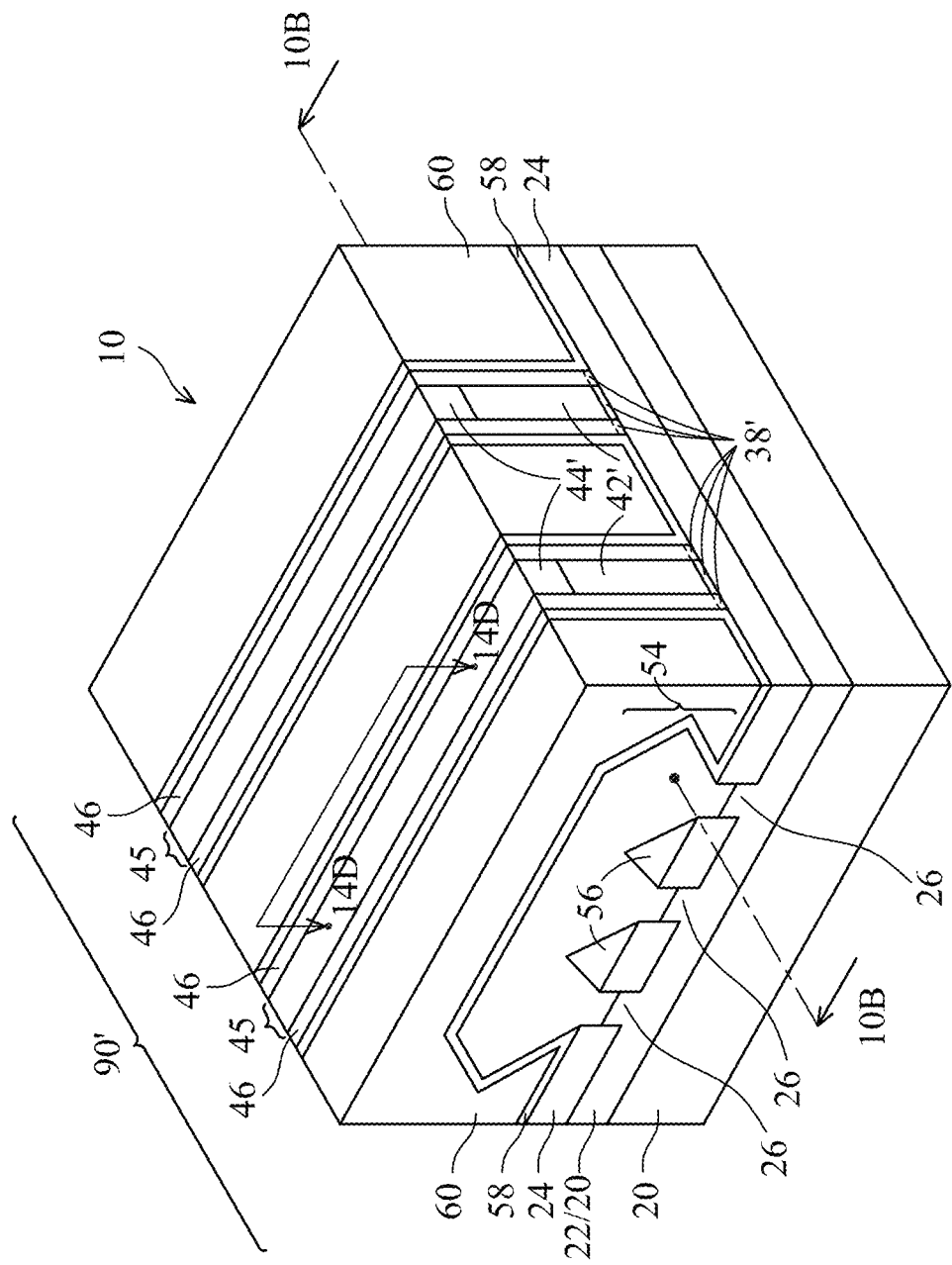
Figure 10B:
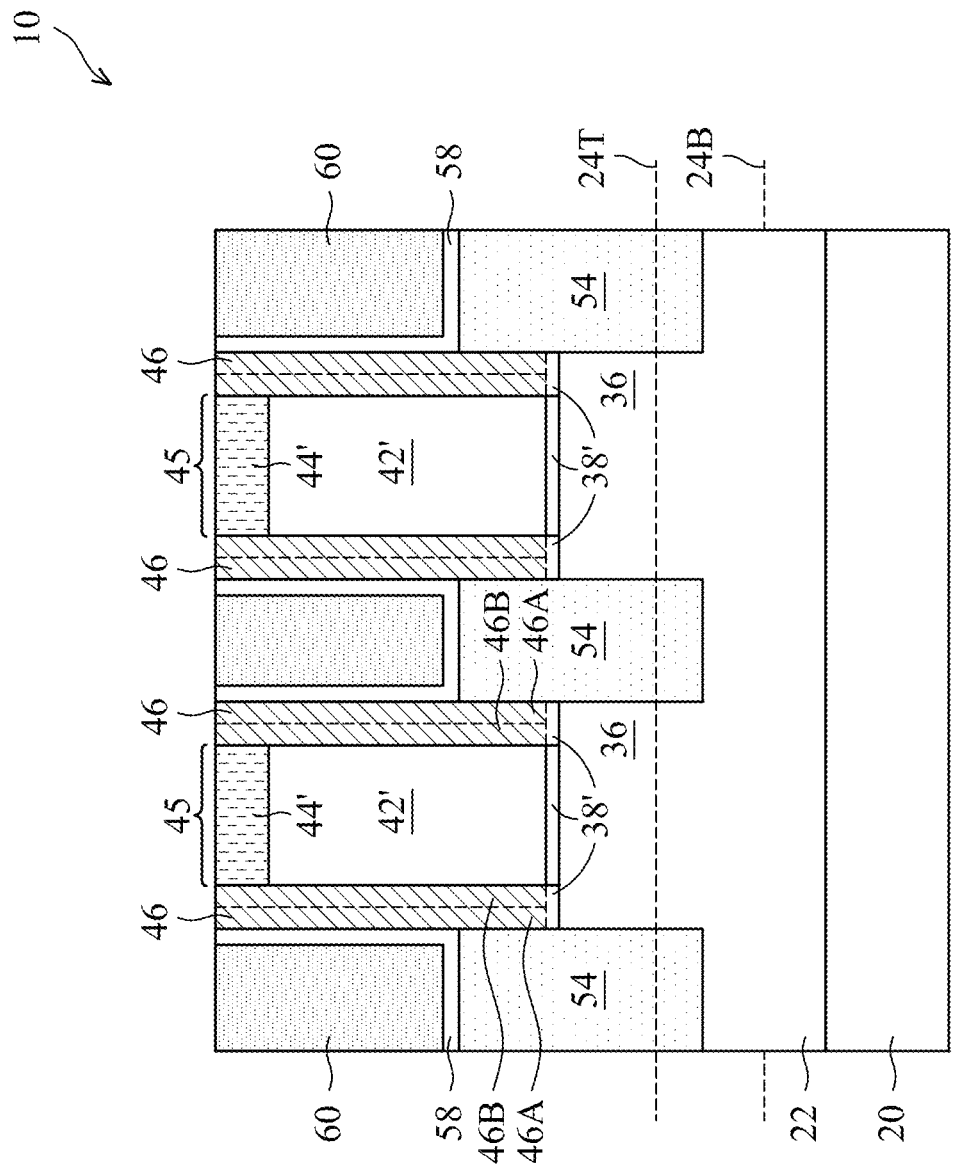

FIG. 10A illustrates a perspective view of the structure after the formation of Contact Etch Stop Layer (CESL) 58 and Inter-Layer Dielectric (ILD) 60. The respective process is illustrated as process 222 in the process flow 200 as shown in FIG. 17. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 45, and gate spacers 46 with each other. FIG. 10B illustrates the cross-section 10B-10B as shown in FIG. 10A. As shown in FIG. 10B, the portions of dummy gate dielectrics 38' directly underlying gate spacers 46 are shown as being dashed to indicate that these portions may or may not exist.

Figure 11A:
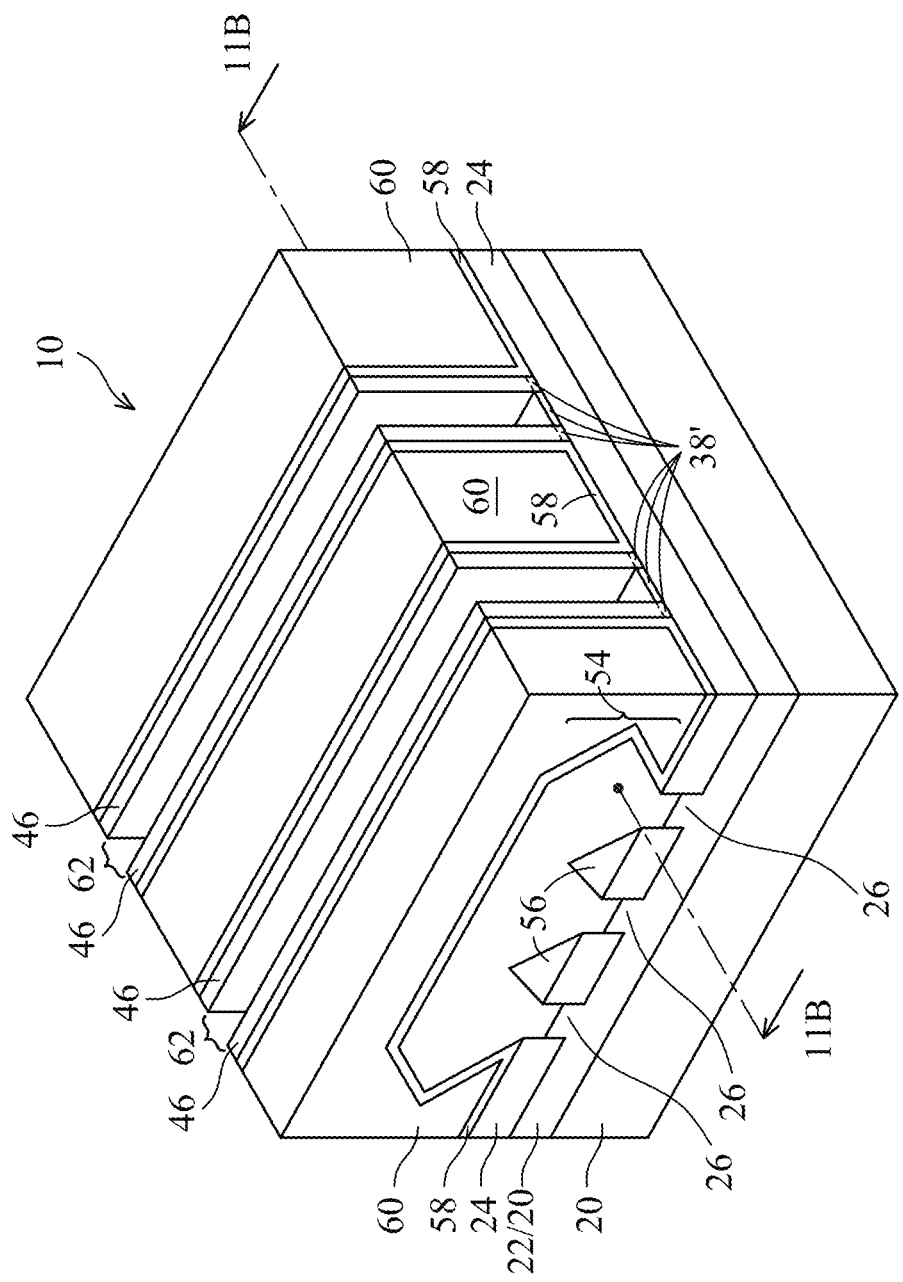
Figure 11B:
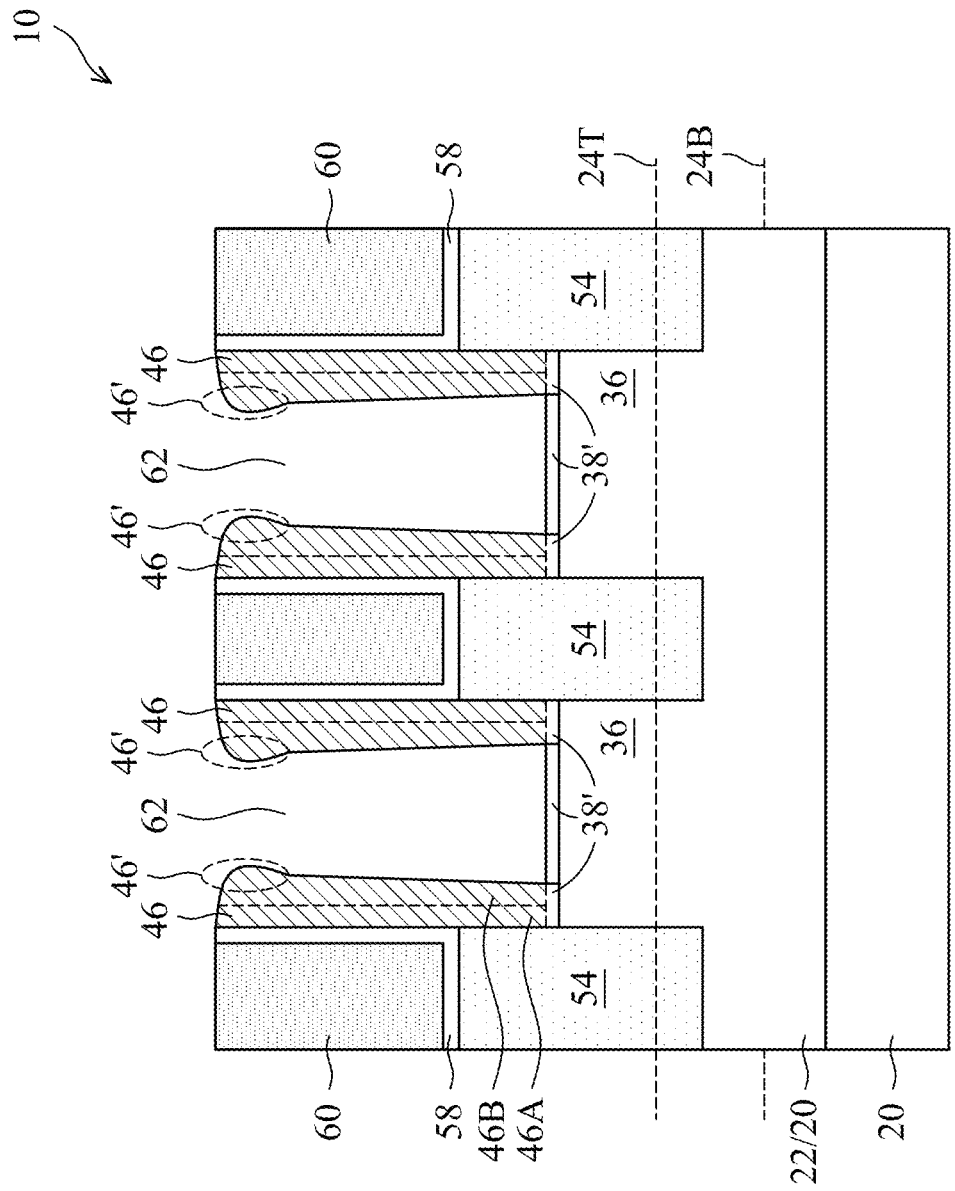

Hard masks 44', dummy gate electrodes 42' are then removed, forming trenches 62 between gate spacers 46, as shown in FIGS. 11A and 11B. The respective process is illustrated as process 224 in the process flow 200 as shown in FIG. 17. FIG. 11B illustrates the reference cross-section 11B-11B as shown in FIG. 11A. In accordance with some embodiments, the removal of dummy gates electrodes 42' is performed using an anisotropic etching process, similar to the patterning process as shown in FIGS. 6A and 6B. In accordance with alternative embodiments, the removal of dummy gates electrodes 42' is performed using an isotropic etching process, which may be a wet etching process or a dry etching process. In the etching of dummy gate electrodes 42', if dummy gate electrodes 42' are pre-maturely etched-through, dummy gate dielectrics 38', with the increased thickness at top, may protect protruding fins 36 from the undesirable damage during the pre-mature removal of dummy gates electrodes 42'. After the removal of dummy gates electrodes 42', dummy gate dielectrics 38' are revealed through trenches 62.

In accordance with some embodiments, gate spacers 46 may include outer portions 46A (FIG. 11B) and inner portions 46B, which are formed of different dielectric materials. For example, inner portions 46B and outer portions 46A may be formed of materials selected from SiN, SiCN, SiOCN, SiON, or the like, while their materials are different from each other. In accordance with some embodiments, one of inner portions 46B and outer portions 46A includes an element that does not exist in the other. In accordance with alternative embodiments, inner portions 46B and outer portions 46A includes same elements, with the percentages of the elements different from each other. The inner portions 46B may have a lower oxygen atomic percentage than outer portions 46A, so that in the removal of dummy gate dielectrics 38', the damage to the inner portions 46B is reduced.

In accordance with some embodiments, as shown in FIG. 11B, the top portions of gate spacers 46 have overhangs 46'. The overhang portions 46' may be formed due to etching selectivity, or due to the slow removal of the wet etching chemical from the bottoms of trenches 62 when wet etching is used. The lower portions of gate spacers 46 are recessed from the respective top portions. The top portions of trenches 62 are thus narrower than the underlying portions, which is referred to the necking of trenches 62.

Figure 12:
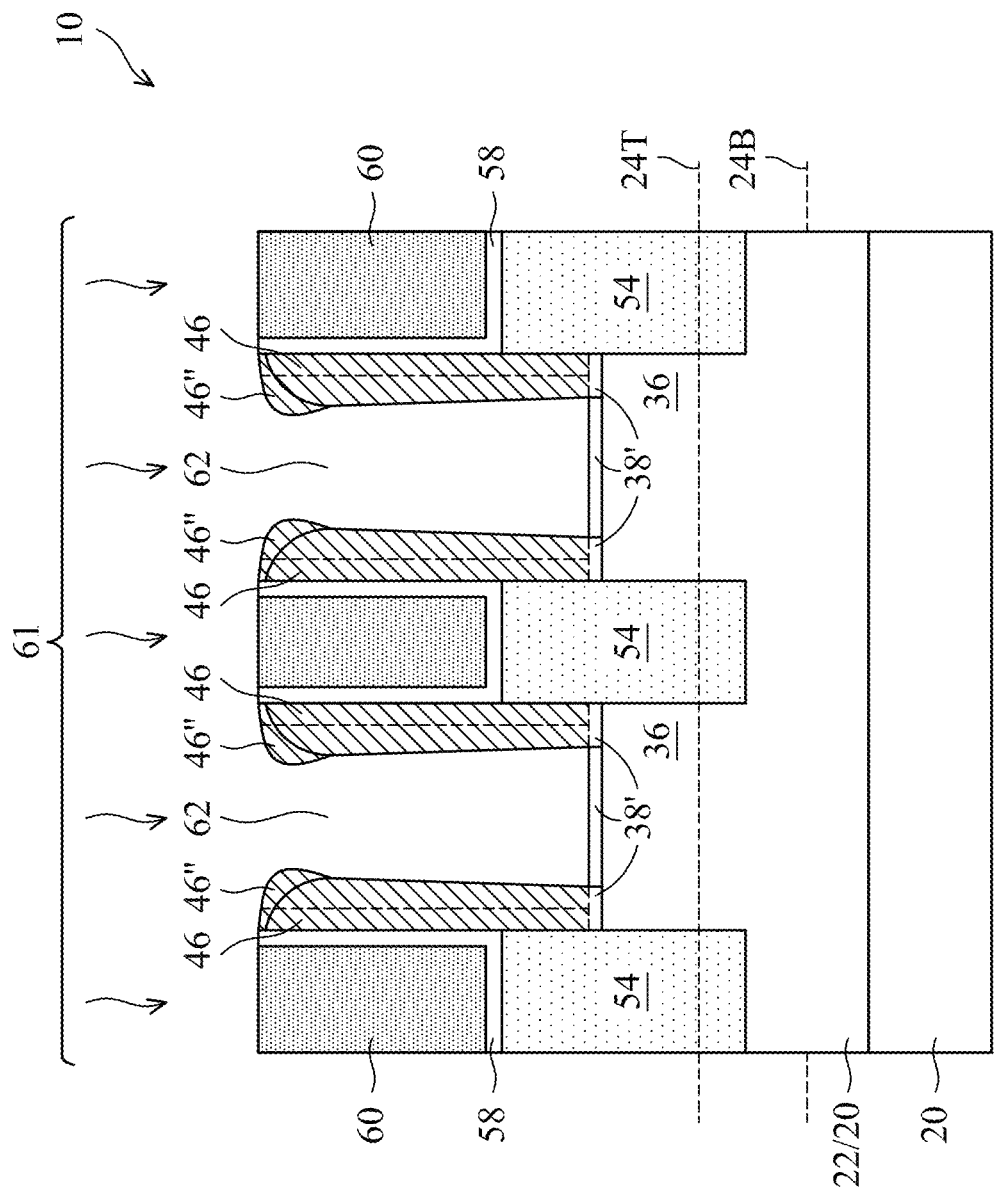

FIG. 12 illustrates a plasma oxidation process 61 performed on wafer 10. The respective process is illustrated as process 226 in the process flow 200 as shown in FIG. 17. In accordance with some embodiments, the plasma oxidation process 61 is performed using process gases such as $O_2$, $O_3$, or the like, or combinations thereof. Inert carrier gases such as He, Ne, Ar, Kr, or the like may also be added. The plasma oxidation process 61 may be performed using a tool same as the deposition tool 300 as shown in FIG. 16, except that the process gas is changed from deposition precursors to oxidation gases to achieve oxidation rather than deposition. In the plasma oxidation process 61, the power PW318 may also be adjusted to be in the range greater than 0 Watts and smaller than about 200 watts. In accordance with some embodiments, the power PW318 is adjusted to be in the range between about 0 watts and about 100 watts. Furthermore, since the plasma oxidation process 61 has a different function than the deposition process (as shown in FIGS. 4A and 4B), the power PW318 used in the plasma oxidation may be different from (greater than or smaller than, although it may also be equal to) the power PW318 used in the deposition process, so that their different purpose may be achieved optimally.

As a result of the plasma oxidation process 61, the overhang portions 46' (FIG. 11B) and some top portions of gate spacers 46 are oxidized to form oxidized portions 46". For the portions of gate spacers 46 that originally include oxygen, more oxygen are added, and the oxidized portions 46" have greater oxygen percentage than the underlying un-oxidized portions. For the portions of gate spacers 46 that originally do not include oxygen, the oxidized portions 46" will have oxygen, while the underlying un-oxidized portions are free from oxygen. The overhang portions 46' (FIG. 11B) are prone to the oxidation since these portions are in the direct paths of oxygen ions and these portions are less flat.

Figure 13:
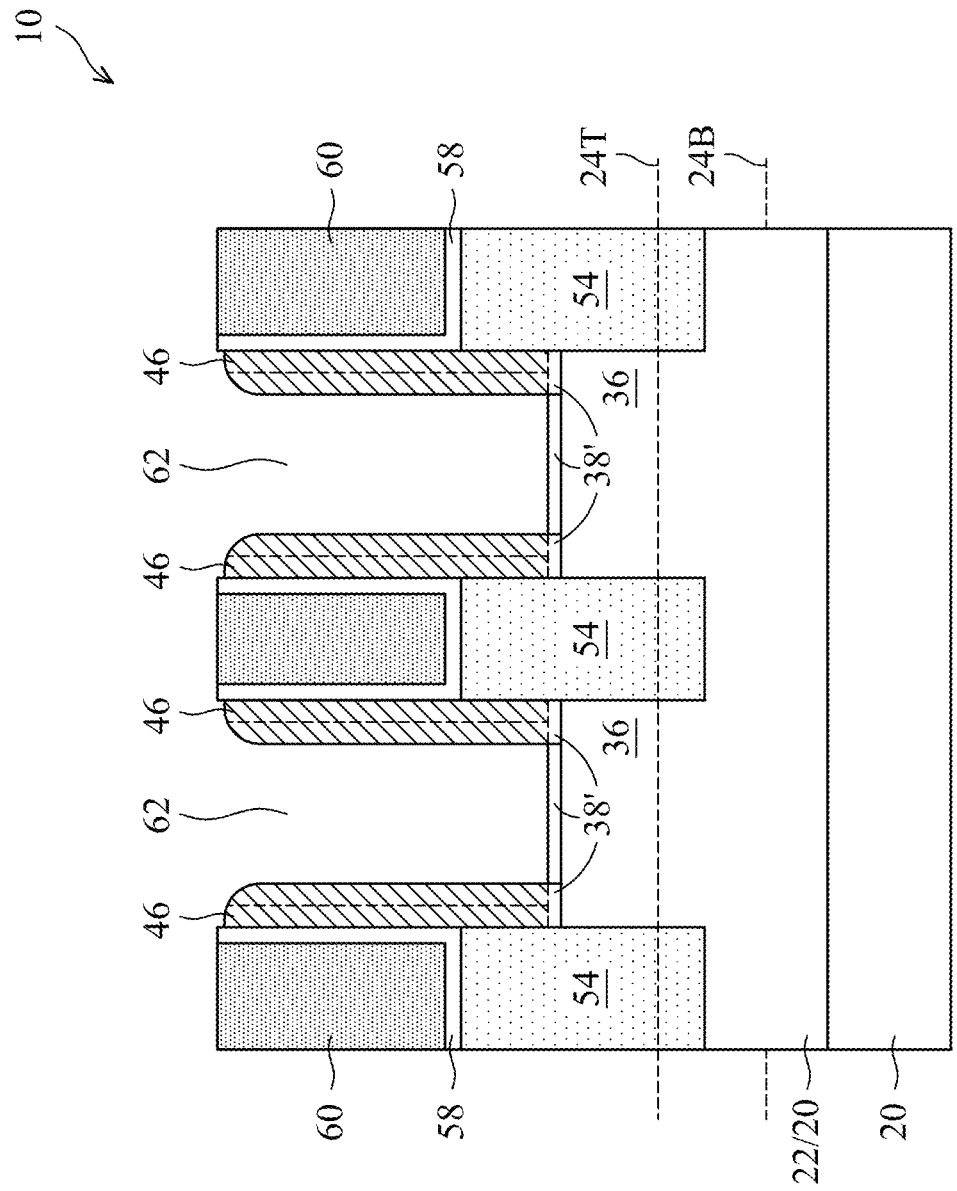

FIG. 13 illustrates the etching process for removing dummy gate dielectrics 38'. The respective process is illustrated as process 228 in the process flow 200 as shown in FIG. 17. In accordance with some embodiments, the etching process may be anisotropic, and the process gas may include the mixture of $NF_3$ and $NH_3$, or the mixture of HF and $NH_3$. The etching process may include isotropic effect and some anisotropic effect to ensure the removal of the sidewall portions of dummy gate dielectrics 38'. In accordance with alternative embodiments, an isotropic etching process such as a wet etching process may be used. For example, a HF solution may be used.

Due to increased oxygen percentage, the oxidized portions 46'' have an increased etching rate in response to the chemical used for the removal of dummy gate dielectrics 38', which chemical is selected to attack dummy gate dielectrics 38' in accordance with some embodiments. Accordingly, the oxidized portions 46'' as shown in FIG. 12 are removed, and the necking effect is eliminated. Trench 62 thus may have vertical lower portions, while the top portions may be rounded and opened wider. This benefits the subsequent formation of gate stacks.

Figure 14A:
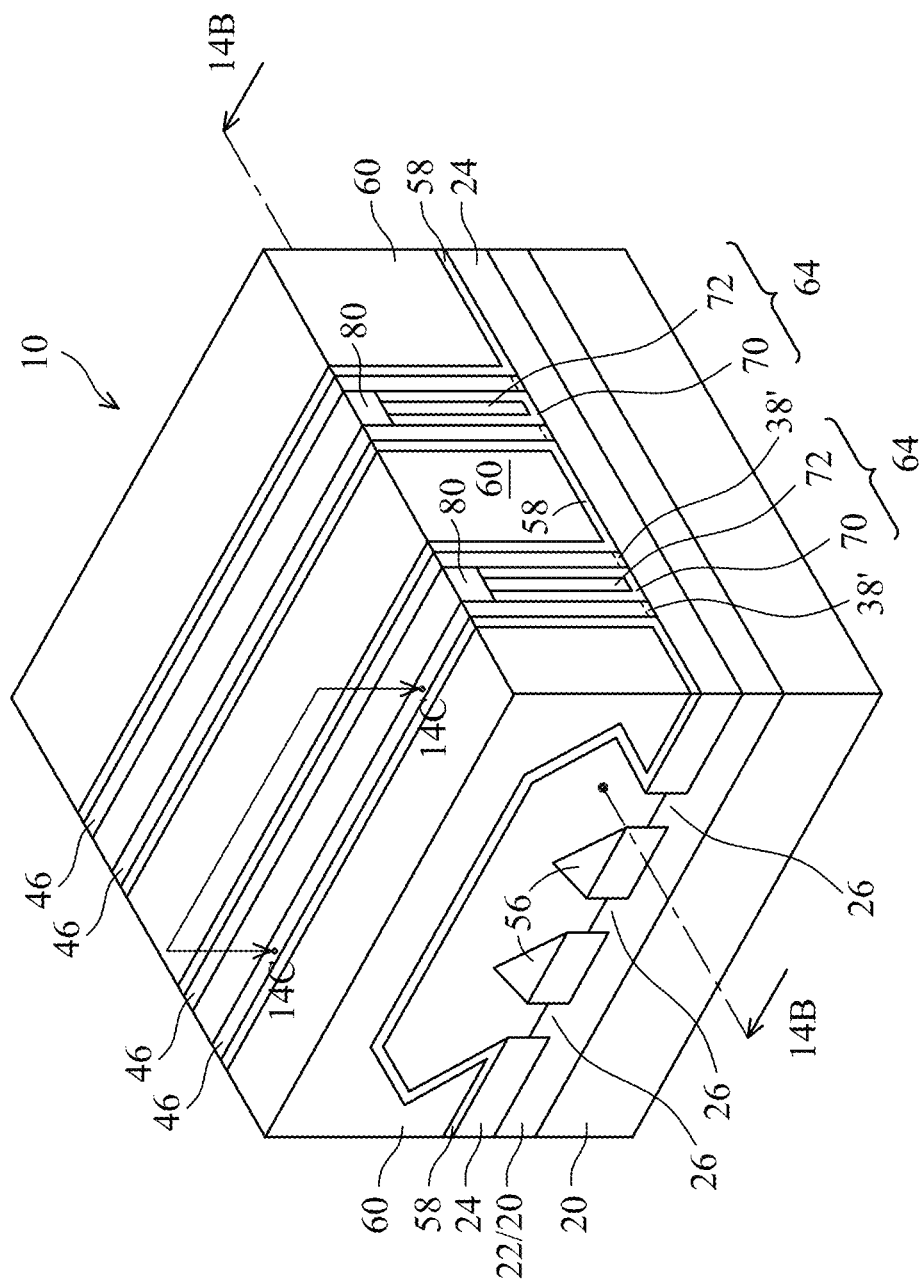
Figure 14B:
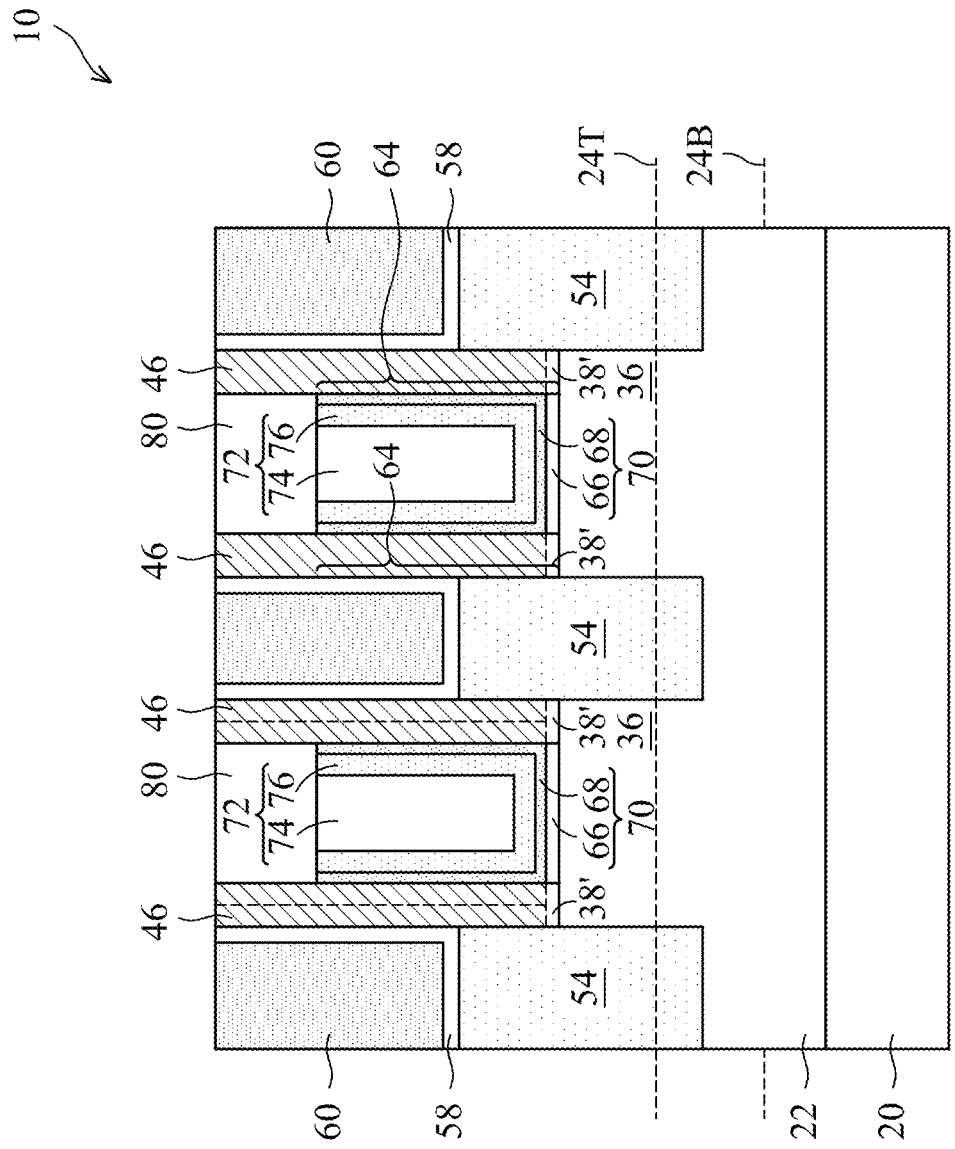
Figure 14D:
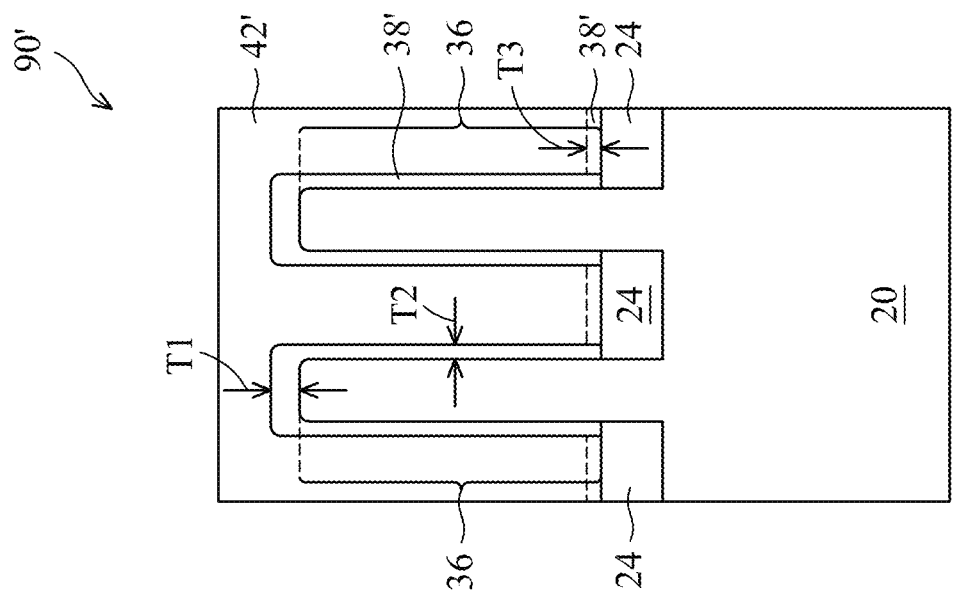
FIG. 14D illustrates a cross-sectional view of a FinFET having a non-conformal gate dielectric in accordance with some embodiments.
Figure 14C:
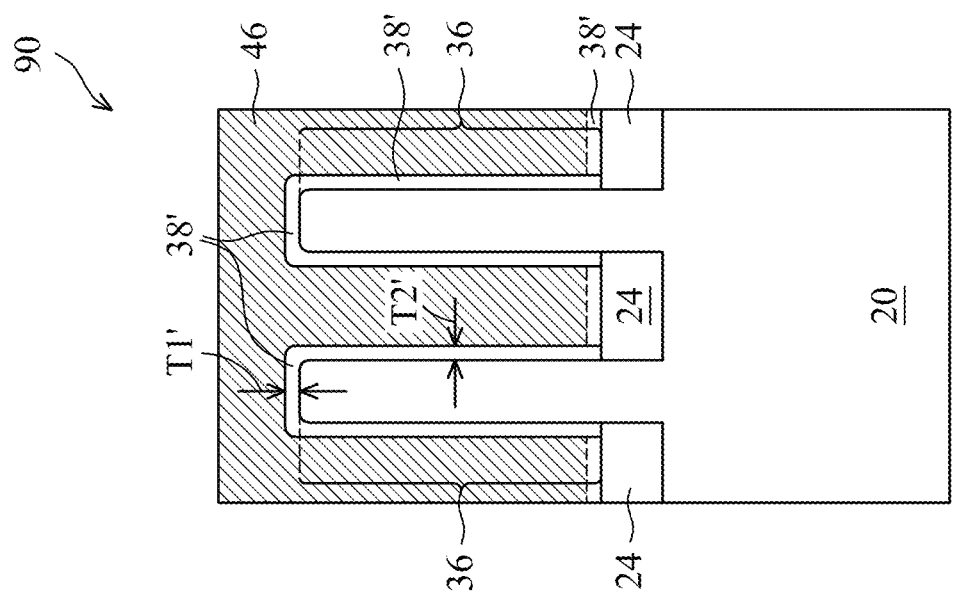

FIGS. 14A, 14B, and 14C illustrate the formation of replacement gate stacks 64 and self-aligned hard masks 80. The respective process is illustrated as process 230 in the process flow 200 as shown in FIG. 17. FIG. 14B illustrates the reference cross-section 14B-14B as shown in FIG. 14A. FIG. 14C illustrates a vertical cross-section 14C-14C as shown in FIG. 14A. As shown in FIGS. 14A and 14B, replacement gate stacks 64 are formed. Gate stack 64 includes gate dielectric 70 and gate electrode 72. Gate dielectric 70 may include Interfacial Layer (IL) 66 and high-k dielectric layer 68 (FIG. 14B). IL 66 is formed on the exposed surfaces of protruding fins 36, and may include an oxide layer such as a silicon oxide layer, which is formed through the thermal oxidation of protruding fins 36, a chemical oxidation process, or a deposition process. High-k dielectric layer 68 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, high-k dielectric layer 68 is formed using ALD, CVD, or the like.

Referring further to FIGS. 14A and 14B, gate electrode 72 is formed on gate dielectric 70. Gate electrode 72 may include stacked layers 74 (FIG. 14B), which may include a diffusion barrier layer (a capping layer), and one or more work-function layer over the diffusion barrier layer. The diffusion barrier layer may be formed of titanium nitride, which may (or may not) be doped with silicon. Titanium nitride, when doped with silicon, is also sometimes referred to as titanium silicon nitride (Ti—Si—N, or TSN). The work-function layer determines the work-function of the gate electrode, and includes at least one layer, or a plurality of layers formed of different materials. The specific material of the work-function layer may be selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the capping layer and the work-function layer, a blocking layer, which may be another TiN layer, may be formed. The blocking layer may be formed using CVD.

Next, metal-filling region 76 is deposited. The formation of metal-filling region 76 may be achieved through CVD, ALD, Physical Vapor Deposition (PVD), or the like. Metal-filling region 76 may be formed of or comprise cobalt, tungsten, alloys thereof, or other metal or metal alloys. Next, a planarization such as a Chemical Mechanical Polish (CMP) process or a mechanical grinding process is performed, so that the top surface of gate stack 64 is coplanar with the top surface of ILD 60.

In a subsequent process, gate stack 64 is etched back, resulting in a recess formed between opposite gate spacers 46. Next, hard mask 80 is formed over replacement gate stack 64. The respective process is illustrated as process 232 in the process flow 200 as shown in FIG. 17. In accordance with some embodiments of the present disclosure, the formation of hard masks 80 includes a deposition process to form a blanket dielectric material, and a planarization process to remove the excess dielectric material over gate spacers 46 and ILD 60. Hard masks 80 may be formed of silicon nitride, for example, or other like dielectric materials.

In the final structure, there may be, or may not be, remaining portions of non-conformal dummy gate dielectrics 38' on protruding fins 36, which remaining portions are directly underlying gate spacers 46. For example, FIG. 14C illustrates the cross-section 14C-14C as shown in FIG. 14A. The remaining dummy gate dielectrics 38', due to various etching and cleaning processes in preceding processes, may have sidewall thickness T2' greater than, equal to, or smaller than top thickness T1'. Furthermore, dummy gate dielectrics 38' may or may not have bottom portions (shown using dashed lines) directly over the STI regions 24.

Figure 15:
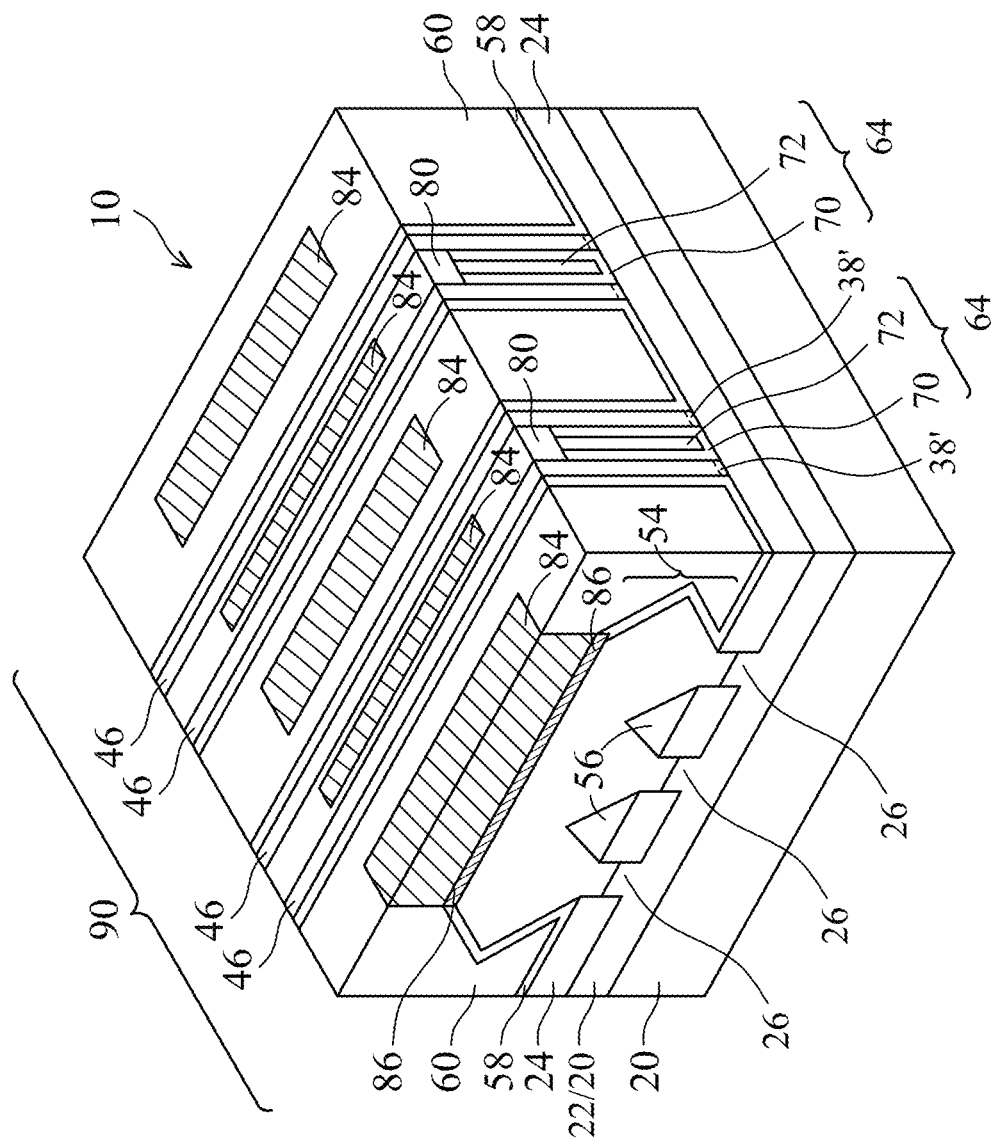

FIG. 15 illustrates some of the features formed in subsequent processes, which may include source/drain contact plugs 84, source/drain silicide regions 86, and the lower portions of gate contact plugs 82. The respective process is illustrated as process 234 in the process flow 200 as shown in FIG. 17. The details of the processes are not discussed herein. FinFET 90 is thus formed.

The dummy gate dielectric layer 38, when formed in first device regions such as core device regions and memory regions (as shown in FIGS. 4A and 4B), may also be formed simultaneously in second device regions such as IO device regions. In accordance with these embodiments, the portions of non-conformal gate dielectric layer 38 in the second device regions are not dummy gate dielectrics. Rather, they act as the actual gate dielectrics of the transistors in the second device regions. FIG. 14D illustrates a cross-section of FinFET 90', which may be an IO transistor in accordance with some embodiments. An example FinFET 90' is shown in FIGS. 10A and 10B. The cross-sectional view shown in FIG. 14D may be obtained from cross-section 14D-14D in FIG. 10A.

Referring again to FIG. 14D, FinFET 90' includes protruding fins 36, and gate dielectrics 38', which are the remaining portions of gate dielectric layer 38 after patterning. The details of the thicknesses T1, T2, and T3 of gate dielectrics 38' have been discussed referring to FIG. 4B, and are not repeated herein. FinFET 90' further includes gate electrode 42', which may be the remaining portions of gate electrode layer 42 (as shown in FIGS. 6A and 6B). The formation of FinFET 90' is similar to discussed in preceding drawings, except that there is no gate replacement process. For example, FinFET 90' may be essentially the same as shown in FIGS. 10A and 10B. It is appreciated that FinFETs 90 (FIGS. 14A, 14B, and 14C) and FinFET 90' (FIGS. 10A, 10B, and 14D) co-exist on same substrate 20 and in the same wafer 10 and the respective device dies cut from the wafer 10.

The embodiments of the present disclosure have some advantageous features. By connecting the E-Chuck (or a conductive plate underlying the E-Chuck) of a deposition chamber to a RF source or a DC source, a non-conformal deposition process may be achieved. When used for forming a dummy gate dielectric layer, the dielectric layer may act as a hard mask to reduce the damage of the underlying protruding fins. In addition, the thicker top portion of non-conformal dummy gate dielectric layer makes the underlying protruding fins to be more resistant to oxide regrowth in subsequent processes. The RF source or the DC source may also be used for reducing overhang in the gate replacement process.

In accordance with some embodiments of the present disclosure, a method includes forming a protruding semiconductor fin protruding higher than isolation regions; depositing a dummy gate dielectric layer on the protruding semiconductor fin, wherein the dummy gate dielectric layer comprises: a top portion overlapping the protruding semiconductor fin; and a sidewall portion on a sidewall of the protruding semiconductor fin, wherein the top portion is thicker than the sidewall portion; depositing a dummy gate electrode layer over the dummy gate dielectric layer; patterning the dummy gate electrode layer, wherein a remaining portion of the dummy gate electrode layer forms a dummy gate electrode of a dummy gate stack; forming gate spacers on opposing sidewalls of the dummy gate stack; removing the dummy gate electrode to form a trench; removing a portion of the dummy gate dielectric layer exposed to the trench; and forming a replacement gate stack in the trench.

In an embodiment, the protruding semiconductor fin is in a wafer, and the depositing the dummy gate dielectric layer is performed using a production tool comprising: a top plate; a bottom plate underlying the top plate, wherein the wafer is placed between the top plate and the bottom plate; and a negative voltage source, wherein the negative voltage source supplies a negative voltage to the bottom plate during the depositing the dummy gate dielectric layer. In an embodiment, the production tool further comprises an RF power source acting as the negative voltage source, wherein the RF power source supplies an RF power to the bottom plate during the depositing the dummy gate dielectric layer. In an embodiment, the RF power source provides a power lower than about 200 watts. In an embodiment, a DC voltage source acts as the negative voltage source, wherein a negative end of the DC voltage source is connected to the bottom plate during the depositing the dummy gate dielectric layer.

In an embodiment, after the patterning the dummy gate electrode layer, the top portion of the dummy gate dielectric layer remains on top of the protruding semiconductor fin, and the gate spacers are formed overlapping the top portion of the dummy gate dielectric layer. In an embodiment, after the patterning the dummy gate electrode layer, the top portion of the dummy gate dielectric layer are etched-through to form a dummy gate dielectric, and the gate spacers contact sidewalls of the dummy gate dielectric. In an embodiment, the method further comprises removing the dummy gate electrode to form the trench, performing a plasma oxidation process on a wafer comprising the protruding semiconductor fin. In an embodiment, the plasma oxidation process is performed in a tool with a negative bias provided to a bottom plate underlying the wafer. In an embodiment, in the removing the portion of the dummy gate dielectric layer exposed to the trench, an overhang portion of the gate spacers overlapping the portion of the dummy gate dielectric layer is oxidized, and during the removing the portion of the dummy gate dielectric layer, the overhang portion is removed.

In accordance with some embodiments of the present disclosure, a method includes forming a dummy gate oxide on a wafer, wherein the dummy gate oxide is formed on a sidewall and a top surface of a protruding semiconductor fin in the wafer, wherein the forming the dummy gate oxide comprises a Plasma Enhanced Chemical Vapor Deposition (PECVD) process in a deposition chamber, and the PECVD process comprises applying a Radio Frequency (RF) power to a conductive plate below the wafer; forming a dummy gate electrode over the dummy gate oxide; removing the dummy gate electrode and the dummy gate oxide to form a trench between opposing gate spacers; and forming a replacement gate in the trench.

In an embodiment, the dummy gate oxide is a non-conformal layer including a top portion on the top surface of the protruding semiconductor fin and a sidewall portion on the sidewall of the protruding semiconductor fin, wherein the top portion is thicker than the sidewall portion. In an embodiment, the applying the RF power comprises connecting an RF power to the conductive plate. In an embodiment, the RF power is lower than about 200 watts. In an embodiment, the forming the dummy gate oxide comprises depositing silicon oxide. In an embodiment, at a time after the dummy gate oxide is removed, portions of the dummy gate oxide remain to be directly underlying the gate spacers, and wherein the portions of the dummy gate oxide comprise a top portion and a sidewall portion thinner than the top portion.

In accordance with some embodiments of the present disclosure, a method includes removing a dummy gate electrode to form a trench between opposing portions of gate spacers, wherein a dummy gate dielectric underlying the dummy gate electrode is exposed, and wherein the dummy gate dielectric has a top portion and a sidewall portion thinner than the top portion; performing a plasma oxidation process on the opposing portions of the gate spacers; after the plasma oxidation process, removing the dummy gate dielectric; and forming a replacement gate stack in the trench. In an embodiment, the plasma oxidation process is performed as having both of an isotropic effect and an anisotropic effect. In an embodiment, the plasma oxidation process is performed with a negative bias applied underlying a respective wafer that comprising the gate spacers. In an embodiment, the negative bias is applied through a RF source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a protruding semiconductor fin protruding higher than isolation regions;
   depositing a dummy gate dielectric layer on the protruding semiconductor fin, wherein the dummy gate dielectric layer comprises:
      a top portion overlapping the protruding semiconductor fin; and
      a sidewall portion on a sidewall of the protruding semiconductor fin, wherein the top portion is thicker than the sidewall portion;
   depositing a dummy gate electrode layer over the dummy gate dielectric layer;

patterning the dummy gate electrode layer, wherein a remaining portion of the dummy gate electrode layer forms a dummy gate electrode of a dummy gate stack;

forming gate spacers on opposing sidewalls of the dummy gate stack;

removing the dummy gate electrode to form a trench;

removing a portion of the dummy gate dielectric layer exposed to the trench; and forming a replacement gate stack in the trench.

2. The method of claim 1, wherein the protruding semiconductor fin is in a wafer, and the depositing the dummy gate dielectric layer is performed using a production tool comprising:

a top plate;

a bottom plate underlying the top plate, wherein the wafer is placed between the top plate and the bottom plate; and a negative voltage source, wherein the negative voltage source supplies a negative voltage to the bottom plate during the depositing the dummy gate dielectric layer.

3. The method of claim 2, wherein the production tool further comprises:

a Radio Frequency (RF) power source acting as the negative voltage source, wherein the RF power source supplies an RF power to the bottom plate during the depositing the dummy gate dielectric layer.

4. The method of claim 3, wherein the RF power source provides a power lower than about 200 watts.

5. The method of claim 2, wherein a DC voltage source acts as the negative voltage source, wherein a negative end of the DC voltage source is connected to the bottom plate during the depositing the dummy gate dielectric layer.

6. The method of claim 1, wherein after the patterning the dummy gate electrode layer, the top portion of the dummy gate dielectric layer remains on top of the protruding semiconductor fin, and the gate spacers are formed overlapping the top portion of the dummy gate dielectric layer.

7. The method of claim 1, wherein after the patterning the dummy gate electrode layer, the top portion of the dummy gate dielectric layer is etched-through to form a dummy gate dielectric, and the gate spacers contact sidewalls of the dummy gate dielectric.

8. The method of claim 1 further comprising, after the removing the dummy gate electrode to form the trench, performing a plasma oxidation process on a wafer that comprises the protruding semiconductor fin.

9. The method of claim 8, wherein the plasma oxidation process is performed in a tool with a negative bias provided to a bottom plate underlying the wafer.

10. The method of claim 9, wherein in the removing the portion of the dummy gate dielectric layer exposed to the trench, an overhang portion of the gate spacers overlapping the portion of the dummy gate dielectric layer is oxidized, and during the removing the portion of the dummy gate dielectric layer, the overhang portion is removed.

11. A method comprising:

forming a dummy gate oxide on a wafer, wherein the dummy gate oxide is formed on a sidewall and a top surface of a protruding semiconductor fin in the wafer, wherein the dummy gate oxide is a non-conformal layer including a top portion on the top surface of the protruding semiconductor fin and a sidewall portion on the sidewall of the protruding semiconductor fin, wherein the top portion is thicker than the sidewall portion, wherein the forming the dummy gate oxide comprises a Plasma Enhanced Chemical Vapor Deposition (PECVD) process in a deposition chamber, and the PECVD process comprises applying a Radio Frequency (RF) power to a conductive plate below the wafer;

forming a dummy gate electrode over the dummy gate oxide;

removing the dummy gate electrode and the dummy gate oxide to form a trench between opposing gate spacers; and forming a replacement gate in the trench.

12. The method of claim 11, wherein the applying the RF power comprises connecting an RF power to the conductive plate.

13. The method of claim 12, wherein the RF power is lower than about 200 watts.

14. The method of claim 11, wherein the forming the dummy gate oxide comprises depositing silicon oxide.

15. The method of claim 11, wherein at a time after the dummy gate oxide is removed, portions of the dummy gate oxide remain to be directly underlying the gate spacers, and wherein the portions of the dummy gate oxide comprise a top portion and a sidewall portion thinner than the top portion.

16. The method of claim 11 further comprising performing a plasma oxidation process on the dummy gate oxide.

17. A method comprising:

removing a dummy gate electrode to form a trench between opposing portions of gate spacers, wherein a dummy gate dielectric underlying the dummy gate electrode is exposed, and wherein the dummy gate dielectric has a top portion and a sidewall portion thinner than the top portion;

performing a plasma oxidation process on the opposing portions of the gate spacers;

after the plasma oxidation process, removing the dummy gate dielectric; and forming a replacement gate stack in the trench.

18. The method of claim 17, wherein the plasma oxidation process is performed as having both of an isotropic effect and an anisotropic effect.

19. The method of claim 18, wherein the plasma oxidation process is performed with a negative bias applied underlying a respective wafer that comprising the gate spacers.

20. The method of claim 19, wherein the negative bias is applied through a RF source.

* * * * *